United States Patent
Uchikawa et al.

(10) Patent No.: US 10,756,764 B2
(45) Date of Patent: Aug. 25, 2020

(54) MEMORY SYSTEM AND CONTROL METHOD

(71) Applicant: Toshiba Memory Corporation, Minato-ku (JP)

(72) Inventors: Hironori Uchikawa, Fujisawa (JP); Toshikatsu Hida, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 59 days.

(21) Appl. No.: 16/104,233

(22) Filed: Aug. 17, 2018

(65) Prior Publication Data
US 2019/0296774 A1    Sep. 26, 2019

(30) Foreign Application Priority Data
Mar. 23, 2018  (JP) ................................. 2018-055737

(51) Int. Cl.
*H03M 13/00*     (2006.01)
*H03M 13/29*     (2006.01)
*G11C 29/52*     (2006.01)
*G06F 11/10*     (2006.01)

(52) U.S. Cl.
CPC ..... *H03M 13/2906* (2013.01); *G06F 11/1068* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 8,656,252 B2 | 2/2014 | So et al. | |
| RE45,783 E * | 10/2015 | Lee | H03M 13/271 |
| 9,158,617 B2 | 10/2015 | Cho et al. | |
| 2010/0275106 A1* | 10/2010 | Song | H04N 21/235 |
| | | | 714/784 |

(Continued)

FOREIGN PATENT DOCUMENTS

JP    5017407    9/2012

OTHER PUBLICATIONS

S. Bates, Z. Chen, L. Gunthorpe, A. E. Pusane, K. S. Zigangirov and D. J. Costello, "A low-cost serial decoder architecture for low-density parity-check convolutional codes," in IEEE Transactions on Circuits and Systems I: Regular Papers, vol. 55, No. 7, pp. 1967-1976, Aug. 2008. (Year: 2008).*

*Primary Examiner* — Daniel F. McMahon
(74) *Attorney, Agent, or Firm* — Oblon, McClelland, Maier & Neustadt, L.L.P.

(57) ABSTRACT

According to one embodiment, a memory system encodes a plurality of data frames written in the same block in an inter-frame direction and generates first parity data, encodes the first parity data in the inter-frame direction and generates second parity data, generates a plurality of pieces of first frame data by concatenating at least a part of the first or second parity data with each of the plurality of data frames, encodes each of the plurality of pieces of first frame data in an intra-frame direction and generates a plurality of third parity data, and writes a plurality of pieces of second frame data obtained by concatenating each of the plurality of pieces of first frame data and each of the plurality of pieces of third parity data in a plurality of pages in the same block in the non-volatile memory one by one.

20 Claims, 16 Drawing Sheets

(56) References Cited

U.S. PATENT DOCUMENTS

| | | | |
|---|---|---|---|
| 2010/0325518 A1* | 12/2010 | Kim | H04H 20/55 |
| | | | 714/755 |
| 2011/0083056 A1* | 4/2011 | Choi | H04H 20/30 |
| | | | 714/756 |
| 2011/0161774 A1 | 6/2011 | Shin et al. | |
| 2011/0219284 A1* | 9/2011 | Uchikawa | G06F 11/10 |
| | | | 714/763 |
| 2011/0239083 A1* | 9/2011 | Kanno | G06F 11/1068 |
| | | | 714/756 |
| 2013/0254622 A1 | 9/2013 | Kanno | |
| 2014/0068379 A1* | 3/2014 | Sakaue | G06F 11/1012 |
| | | | 714/764 |
| 2014/0245100 A1 | 8/2014 | Kanno | |
| 2015/0234705 A1 | 8/2015 | Kanno | |
| 2016/0188459 A1* | 6/2016 | Kanno | G06F 12/0246 |
| | | | 711/103 |
| 2019/0073266 A1* | 3/2019 | Khon | G06F 3/061 |

\* cited by examiner

MEMORY SYSTEM AND CONTROL METHOD

CROSS-REFERENCE TO RELATED APPLICATIONS

This application is based upon and claims the benefit of priority from Japanese Patent Application No. 2018-055737, filed on Mar. 23, 2018; the entire contents of all of which are incorporated herein by reference.

FIELD

Embodiments described herein relate generally to a memory system and a control method.

BACKGROUND

In non-volatile semiconductor memories, a plurality of memory cells, each replacing each piece of information with an amount of charges and holding the amount of charges are installed in a chip. A plurality of memory cells in the chip are divided into a plurality of groups called blocks, and each block is further divided into groups called pages including a plurality of memory cells. For example, the "block" is a minimum unit for erasing data in a chip, and the "page" is a minimum unit for writing/reading data to/from the chip.

In a memory cell which replaces information with an amount of charges and holds the amount of charges, information is recorded in association with a magnitude of the amount of charges. Therefore, in a case in which it is unable to be set to a desired amount of charges at the time of writing or in a case in which charges are discharged with the lapse of time, an error occurs in information read from the memory cell. An error caused by a fluctuation in the amount of charges is referred to as a soft error. As a countermeasure against the soft error, a method of performing error correction coding on information data to be recorded and recording redundant data generated by the error correction coding in a chip together with the information data is known. Such error correction coding is commonly performed in units of pages or in units of sub pages obtained by dividing page data.

DETAILED DESCRIPTION

Figure 1:
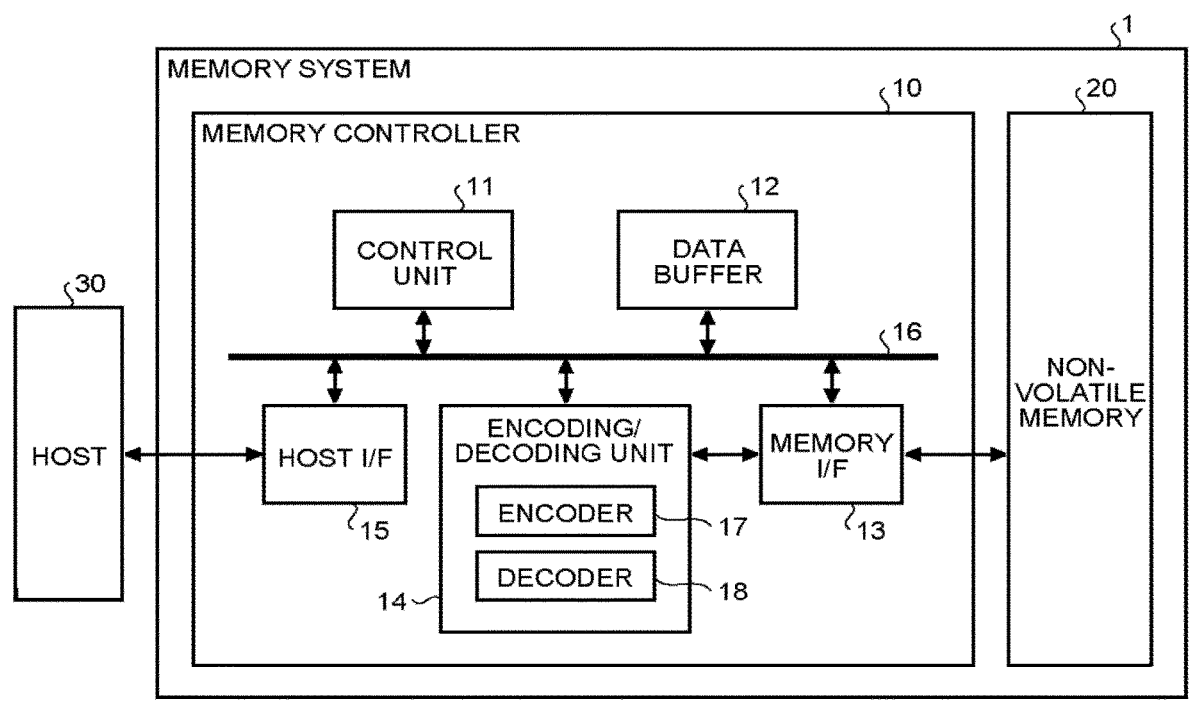
FIG. 1 is a block diagram illustrating a schematic configuration example of a memory system according to a first embodiment.

In general, according to one embodiment, a memory system includes a non-volatile memory including a plurality of blocks, each block including a plurality of pages, a memory interface that executes writing and reading on the non-volatile memory, a first encoder that encodes a plurality of data frames written in the same block among the plurality of blocks in an inter-frame direction and generates first parity data, a second encoder that divides the first parity data into a plurality of parity frames, encodes the plurality of parity frames in an inter-frame direction, and generates second parity data, and a third encoder that generates a plurality of pieces of first frame data by concatenating at least a part of the first parity data and/or at least a part of the second parity data with each of the plurality of data frames, encodes each of the plurality of pieces of first frame data in an intra-frame direction, and generates a plurality of pieces of third parity data, wherein the memory interface writes a plurality of pieces of second frame data obtained by concatenating each of the plurality of pieces of first frame data and each of the plurality of pieces of third parity data in the plurality of pages in the same block in the non-volatile memory one by one.

Exemplary embodiments of a memory system and a control method will be described below in detail with reference to the accompanying drawings. The present invention is not limited to the following embodiments.

In non-volatile semiconductor memories (hereinafter referred to simply as non-volatile memories), a soft error rate of each page fluctuates greatly due to a device manufacturing variation. For this reason, in a case in which the error correction code is configured for pages with a high soft error rate, a strong error correction capability is necessary, leading to an increase in a redundant data amount. Further, in the non-volatile memories, an error of a unit larger than a memory cell such as a page or a block may occur due to a failure of a readout circuit, an input/output buffer, or the like. If an error of such a large unit occurs, it is unable to be corrected by the error correction code in units of pages.

In this regard, a method of protecting user data using an error correction code intended for performing error correction in a direction across a page (hereinafter referred to as an inter-page direction) (hereinafter referred to as an inter-page code) in addition to the error correction code intended for performing error correction in units of pages (hereinafter referred to as an intra-page code) is considered. Here, in a case in which the error correction coding is performed in the inter-page direction, pages and blocks for storing redundant data in the inter-page direction may be necessary separately.

Further, as a recent non-volatile semiconductor memory, a so-called three-dimensional structure flash memory in which a storage capacity per unit area is significantly improved by employing a three-dimensional structure is known. In the three-dimensional structure flash memory, a storage capacity per block which is an erasing unit increases, whereas the number of blocks on a memory chip tends to decrease. For this reason, there are cases where it is difficult to secure a page or a block dedicated to redundant data in the three-dimensional structure flash memory.

In this regard, in the following embodiments, several examples of a memory system and a control method which are capable of performing the error correction in the inter-page direction while reducing the number of pages secured for the redundant data will be described. In the following description, the block may be a physical block or a logical block. The logical block may be a data unit defined by gathering a plurality of pages dispersed in different physical blocks, and the logical block may have the same data size as the physical block or a different data size from the physical block.

First Embodiment

FIG. 1 is a block diagram illustrating a schematic configuration example of a memory system according to the first embodiment. As illustrated in FIG. 1, a memory system 1 includes a memory controller 10 and a non-volatile memory 20. The memory system 1 is connectable to a host 30, and the state in which the memory system 1 is connected to the host 30 is illustrated in FIG. 1. The host 30 may be, for example, an electronic device such as a personal computer or a mobile terminal.

The non-volatile memory 20 is a non-volatile memory that stores data in a non-volatile manner, and is, for example, a NAND flash memory (hereinafter referred to simply as a NAND memory). In the following description, a case in which a NAND memory is used as the non-volatile memory 20 will be described, but various storage devices such as a three-dimensional structure flash memory, resistance random access memory (ReRAM), or a ferroelectric random access memory (FeRAM) may be used as the non-volatile memory 20. Further, preferably, the non-volatile memory 20 is a semiconductor memory, and the present embodiment can be applied to various storage media other than the semiconductor memory.

The memory system 1 may be a memory card or the like in which the memory controller 10 and the non-volatile memory 20 are configured as one package or may be a solid state drive (SSD) or the like.

The memory controller 10 is, for example, a semiconductor integrated circuit configured as a System-On-a-Chip (SoC). Some or all of operations of constituent elements of the memory controller 10 to be described below may be implemented by a central processing unit (CPU) executing firmware or may be implemented by hardware.

The memory controller 10 controls writing to the non-volatile memory 20 in accordance with a write request from the host 30. Further, the memory controller 10 controls reading from the non-volatile memory 20 in accordance with a read request from the host 30. The memory controller 10 includes a host interface (I/F) 15, a memory I/F 13, a control unit 11, an encoding/decoding unit (codec) 14, and a data buffer 12. The host I/F 15, the memory I/F 13, the control unit 11, the encoding/decoding unit 14, and the data buffer 12 are connected to one another via an internal bus 10.

The host I/F 15 performs processing according to an interface standard with the host 30, and outputs a request received from the host 30, user data of a write target, or the like to the internal bus 16. Further, the host I/F 15 transmits user data which is read out from the non-volatile memory 20 and restored, a response from the control unit 11, or the like to the host 30.

The memory I/F 13 performs a write process on the non-volatile memory 20 on the basis of the instruction of the control unit 11. Further, the memory I/F 13 performs a read process on the non-volatile memory 20 on the basis of an instruction of the control unit 11.

The control unit 11 controls the respective constituent elements of the memory system 1 in general. In a case in which an instruction is received from the host 30 via the host I/F 15, the control unit 11 performs control according to the instruction. For example, the control unit 11 instructs the memory I/F 13 to perform writing to the non-volatile memory 20 in accordance with an instruction from the host 30. Further, the control unit 11 instructs the memory I/F 13 to perform reading from the non-volatile memory 20 in accordance with an instruction from the host 30.

In a case in which a write request is received from the host 30, the control unit 11 decides a storage region (a memory region) on the non-volatile memory 20 for the user data stored in the data buffer 12. That is, the control unit 11 manages a write destination of the user data. A correspondence between a logical address of the user data received from the host 30 and a physical address indicating a storage region on the non-volatile memory 20 in which the user data is stored is stored as an address translation table.

Further, when the read request is received from the host 30, the control unit 11 converts a logical address designated by the read request into a physical address using the address translation table, and instructs the memory I/F 13 to perform reading from the physical address.

Here, in the NAND memory, writing and reading are generally performed in units of data called a page, and erasing is performed in units of data called a block. In the present embodiment, a plurality of memory cells connected to the same word line are referred to as a memory cell group. In a case in which the memory cell is a single level cell (SLC), one memory cell group corresponds to one page. In a case in which the memory cell is a multiple level cell (MLC), one memory cell group corresponds to a plurality of pages. In this description, a triple level cell (TLC), a quad level cell (QLC), and the like are assumed to be included as the MLC. Further, each memory cell is connected to a word line and a bit line. Therefore, each memory cell can be identified by an address identifying the word line and an address identifying the bit line.

The data buffer 12 temporarily stores the user data received from the host 30 by the memory controller 10 until the user data is stored in the non-volatile memory 20. Further, the data buffer 12 temporarily stores the user data read from the non-volatile memory 20 and restored until the user data is transmitted to the host 30. For example, a general purpose memory such as a static random access memory (SRAM) or a dynamic random access memory (DRAM) can be used as the data buffer 12.

The user data transmitted from the host 30 is transferred to the internal bus 16 and temporarily stored in the data buffer 12. The encoding/decoding unit 14 encodes the user data stored in the non-volatile memory 20 and generates a code word. Further, the encoding/decoding unit 14 decodes a reception word read from the non-volatile memory 20 and restores the user data. In this regard, the encoding/decoding unit 14 includes an encoder 17 and a decoder 18. In addition to the user data, control data or the like used in the memory controller 10 may be included in data encoded by the encoding/decoding unit 14. Further, in the present embodiment, the encoding/decoding unit 14 is configured as a unit independent of the memory I/F 13 but is not limited to such a configuration, and the encoding/decoding unit 14 may be incorporated into the memory I/F 13.

The encoder 17 encodes the user data on the data buffer 12 on the basis of an instruction from the control unit 11 and generates a code word. The decoder 18 decodes a reception word read from a designated address of the non-volatile memory 20 on the basis of an instruction from the control unit 11.

In the present embodiment, the code word generated by the encoder 17 is, for example, a multi-dimensional error correction code represented by a product code. The multi-dimensional error correction code is, for example, a code having a structure in which each symbol which is a constituent unit of the error correction code is protected in a multiple manner through a plurality of component codes. Each symbol may include, for example, an element of an alphabet such as one bit (an element of a binary field) or a finite field other than a binary field. In this regard, in the following description, for the sake of simplicity, a two-dimensional error correction code in which each symbol is protected by two component codes having different dimensions will be described as an example. At this time, a Reed-Solomon (RS) code is used as an example for a component code of a dimension corresponding to the inter-page direction (hereinafter referred to as an inter-page code). On the other hand, for example, a Bose-Chaudhuri-Hocguenghem (BCH) code, a Low-Density Parity-Check (LDPC) code, or the like can be used as a component code of a dimension corresponding to the intra-page direction (also referred to as an inline direction) (hereinafter referred to as an intra-page code).

Figure 2:
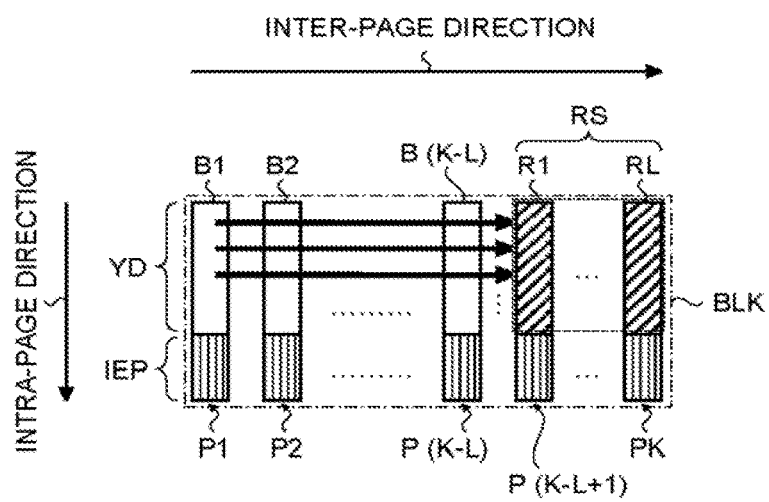
FIG. 2 is a schematic diagram illustrating a schematic configuration example of an error correction code using a Reed-Solomon code according to a related art.

Next, an error correction code according to the present embodiment will be described in detail with reference to the appended drawings together with a comparison with an error correction code according to a related art. FIG. 2 is a schematic diagram illustrating an example of a schematic configuration of an error correction code in which a Reed-Solomon code of a related art is used as the inter-page code. In the example illustrated in FIG. 2, one block BLK includes K pages P1 to PK.

In the error correction code illustrated in FIG. 2, user data YD including (K-L) user data frames B1 to B(K-L) is stored in (K-L) pages P1 to P(K-L) among K pages constituting a block BLK. Further, Reed-Solomon parity data RS including L Reed-Solomon parity frames R1 to RL generated by performing Reed-Solomon coding on the user data frames B1 to B(K-L) in the inter-page direction is stored in pages P(K-L1) to PK. Therefore, in the error correction code illustrated in FIG. 2, it is possible to perform the error correction on L error symbol in the inter-page direction in a case in which a position (page) of an error symbol in the user data YD is known and (L/2) error symbols (here, a decimal is rounded off) in a case in which the position (page) of the error symbol is not known. Further, in the respective pages P1 to PK, a parity (hereinafter referred to as inline ECC parity) IEP generated by performing the error correction coding on the user data frames B1 to B(K-L) or the Reed-Solomon parity frames R1 to RL stored in respective pages using the BCH code, the LDPC code, or the like is stored.

As described above, in the related art, in a case in which the user data YD is protected using the Reed-Solomon code (the Reed-Solomon parity data RS) intended for performing the error correction in the inter-page direction, it is necessary to secure the dedicated pages P(K-L+1) to PK for storing the Reed-Solomon parity frames R1 to RL in addition to the pages P1 to P(K-L) for storing the user data frames B1 to B(K-L). Alternatively, in a case in which a storage destination of the inter-page code is another block, it is necessary to secure a dedicated block for storing the inter-page code separately from the block for storing the user data YD. In this description, "dedicated" means "for redundant data not storing user data".

Figure 3:
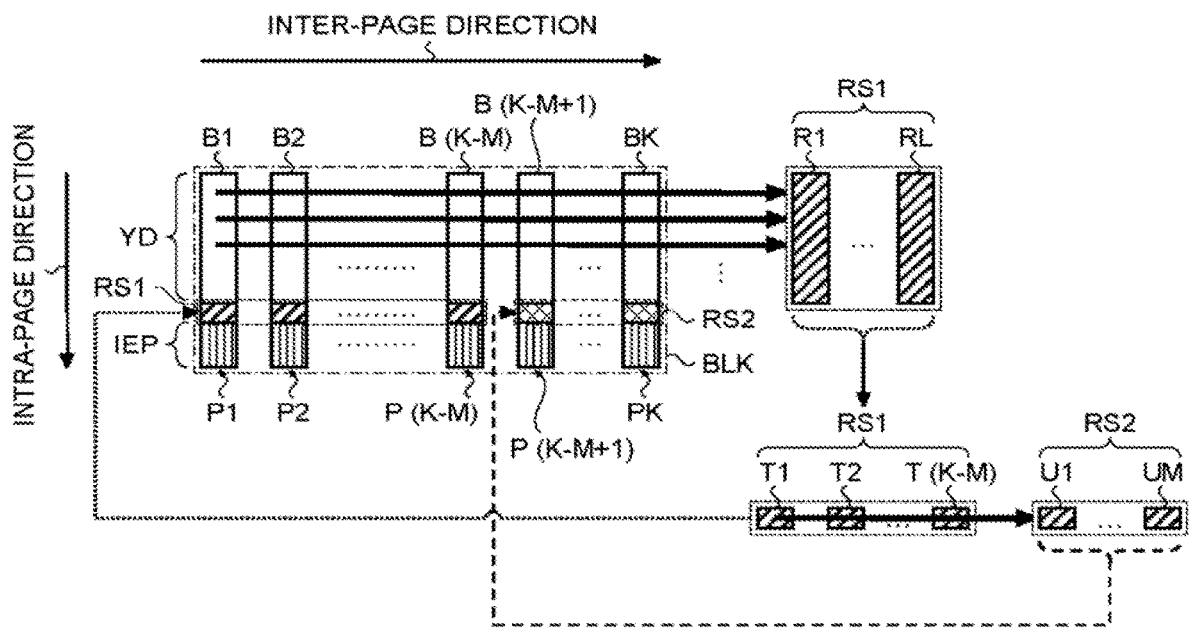
FIG. 3 is a schematic diagram illustrating a schematic configuration example of an error correction code according to the first embodiment.

On the other hand, FIG. 3 is a schematic diagram illustrating a schematic configuration example of an error correction code according to the present embodiment. In the example illustrated in FIG. 3 similarly to the example illustrated in FIG. 2, it is possible to perform the error correction on L error symbol in the inter-page direction in a case in which a position (page) of an error symbol in the user data YD is known and (L/2) error symbols (here, a decimal is rounded off) in a case in which the position (page) of the error symbol is not known.

In the example illustrated in FIG. 3, similarly to the example illustrated in FIG. 2, one block BLK includes K pages P1 to PK. However, in the error correction code illustrated in FIG. 3, the user data YD including the K user data frames B1 to BK which are equal in number to the number of pages is stored in all the pages P1 to PK constituting the block BLK.

First Reed-Solomon parity data RS1 for protecting the user data YD in the inter-page direction is generated by performing the Reed-Solomon coding on the user data frames P1 to BK in the inter-page direction. The first Reed-Solomon parity data RS1 generated accordingly includes, for example, L first Reed-Solomon parity frames R1 to RL.

In the present embodiment, the first Reed-Solomon parity data RS1 is reconstructed into (K-M) first Reed-Solomon data frames T1 to T(K-M) and stored in pages P1 to P(K-M) together with user data frames B1 to B(K-M). Second Reed-Solomon parity data RS2 including M second Reed-Solomon data frames U1 to UM generated by performing the Reed-Solomon coding on the first Reed-Solomon parity data RS1 is stored in the remaining pages P (K-M+1) to PK together with user data frames B(K-M+1) to BK. Therefore, in the error correction code illustrated in FIG. 3, it is possible to perform the error correction on L error symbol in the inter-page direction in a case in which a position (page) of an error symbol in the user data YD is known and (L/2) error symbols (here, a decimal is rounded off) in a case in which the position (page) of the error symbol is not known, and it is possible to perform the error correction on M error symbol in the inter-page direction in a case in which a position (page) of an error symbol in the first Reed-Solomon parity data RS1 is known and (M/2) error symbols (here, a decimal is rounded off) in a case in which the position (page) of the error symbol is not known. A method of storing the first Reed-Solomon parity data RS1 and the second Reed-Solomon parity data RS2 is not limited to the method illustrated in FIG. 3, and various modifications can be made. For example, it is possible to store both the first Reed-Solomon parity data RS1 and the second Reed-Solomon parity data RS2 in all the pages of P1 to PK in a distributed manner. In this case, if a data length of a region in which the RS parity of each page is stored (hereinafter referred to as an RS parity region) is indicated by G, the first Reed-Solomon parity data RS1 is stored in G(K-M/K) regions in the RS parity region of each page in a distributed manner, and the second Reed-Solomon parity data RS2 is stored in the remaining G(M/K) regions in the RS parity region of each page in a distributed manner.

As described above, in the present embodiment, the user data YD is protected at the two steps using the two inter-page codes (redundant data), that is, the first Reed-Solomon parity data RS1 for saving the user data YD from the burst error and the second Reed-Solomon parity data RS2 for saving the first Reed-Solomon parity data RS1 from the burst error. With such a two-step protection, even when the inter-page codes (RS1 and RS2) are stored in the same page as the user data YD, rather than the dedicated page or block, it is possible to correct the burst error occurred in the user data YD.

Similarly to the example illustrated in FIG. 2, in the respective pages P1 to PK, the inline ECC parity IEP obtained by performing the error correction coding on the user data frames B1 to BK and the first Reed-Solomon data frames T1 to T(K-M) or the second Reed-Solomon data frames U1 to UM stored in the respective pages using the BCH code, the LDPC code or the like is stored.

Figure 4:
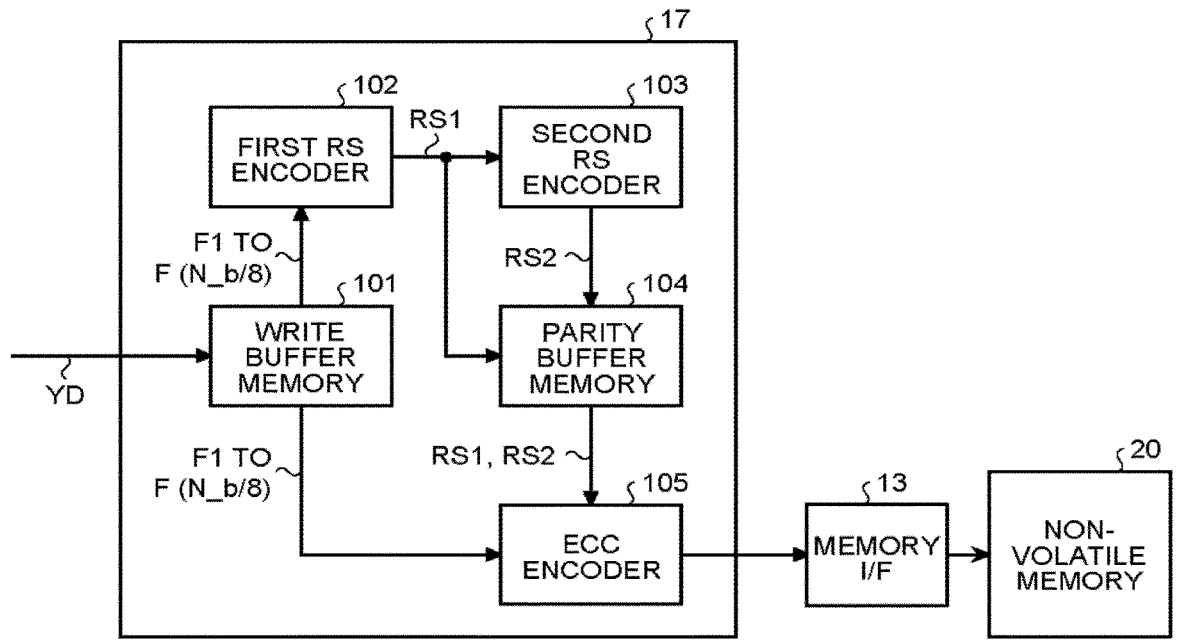
FIG. 4 is a block diagram illustrating a schematic configuration example of an encoder according to the first embodiment.
Figure 5:
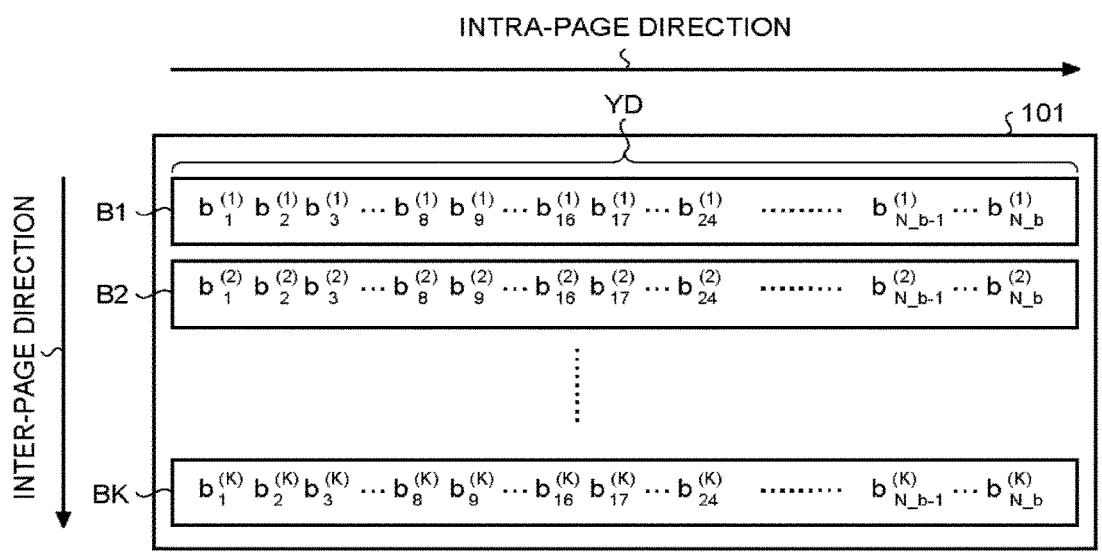
FIG. 5 is a diagram illustrating a frame configuration example of user data in the first embodiment.
Figure 6:
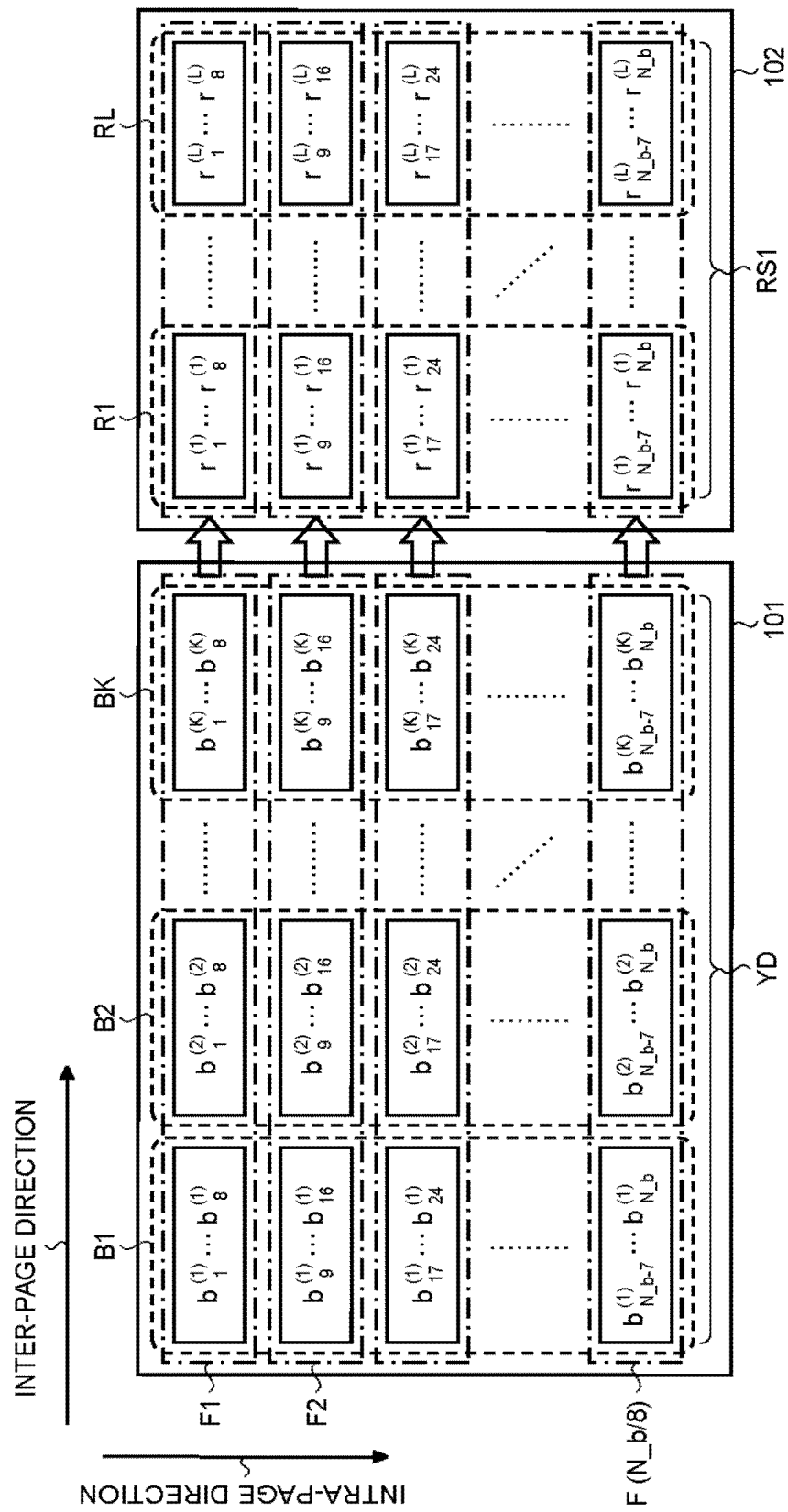
FIG. 6 is a diagram for describing the flow when an encoder according to the first embodiment generates an error correction code (1/3)
Figure 7:
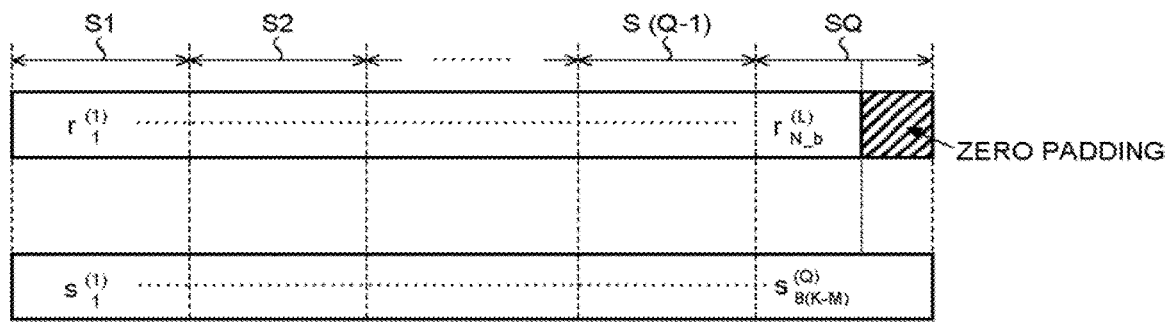
FIG. 7 is a diagram for describing the flow when an encoder according to the first embodiment generates an error correction code (2/3)
Figure 8:
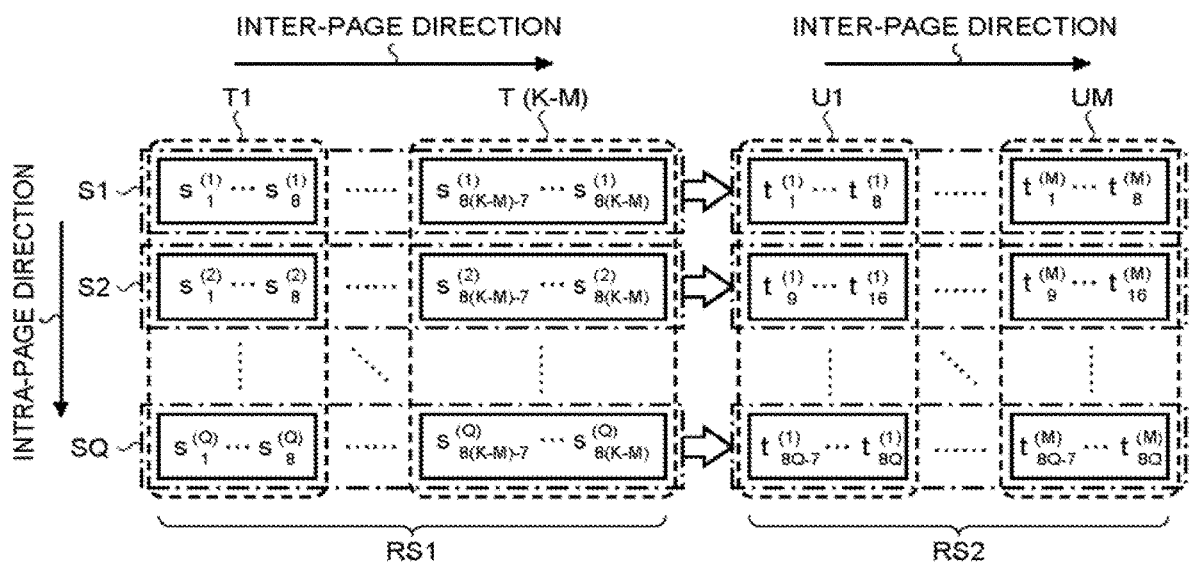
FIG. 8 is a diagram for describing the flow when an encoder according to the first embodiment generates an error correction code (3/3)

Next, the encoder 17 (see FIG. 1) according to the present embodiment will be described in detail with reference to the appended drawings. FIG. 4 is a block diagram illustrating a schematic configuration example of the encoder according to the present embodiment. FIG. 5 is a diagram illustrating a frame configuration example of the user data YD in the present description. FIGS. 6 to 8 are diagrams for describing the flow when the encoder 17 generates the error correction code.

As illustrated in FIG. 4, the encoder 17 includes a write buffer memory 101, a first RS coder 102, a second RS encoder 103, a parity buffer memory 104, and an ECC encoder 105.

For example, the user data YD input from the data buffer 12 (see FIG. 1) to the encoder 17 of the encoding/decoding unit 14 in accordance with an instruction from the control unit 11 is accumulated in the write buffer memory 101. As illustrated FIG. 5, the user data YD in the present description is assumed to include K user data frames B1 to BK necessary when the first RS encoder 102 performs encoding.

As illustrated in FIG. 6, inter-page data frames F1 to F(N_b/8) extracted from the user data frames B1 to BK in the write buffer memory 101 by the number of bits of an encoding symbol unit (eight bits in this description) are input to the first RS encoder 102. In FIGS. 5 and 6, the inter-page direction and the intra-page direction are switched for the sake of convenience of description. Further, in FIG. 6, the number of bits of 1 symbol is set to eight but may be a value that varies depending on the size of the finite field of the Reed-Solomon code used for the encoding in the first RS encoder 102. Further, in a case in which N_b/8 is not an integer when the inter-page data frames B1 to BK, (N_b/8) are constituted from the user data frames B1 to BK, N_b/8 is replaced with an integer obtained by rounding up a decimal. At this time, bits or symbols that are insufficient due to rounding up may be compensated by, for example, zero padding or the like.

The first RS encoder 102 generates the first Reed-Solomon parity data RS1 of a total of L×N_b bits each configured with a parity of every L symbols for the inter-page data frames F1 to F(N_b/8) input from the write buffer memory 101. The generated first Reed-Solomon parity data RS1 constitute L first Reed-Solomon parity frames R1 to RL which are equal in number to the number of symbols as the user data frames B1 to BK in the intra-page direction. The first Reed-Solomon parity data RS1 generated by the first RS encoder 102 is input to the second RS encoder 103 and stored in the parity buffer memory 104.

The second RS encoder 103 generates the second Reed-Solomon parity data RS2 that enables the error correction of M symbols on the input first Reed-Solomon parity data RS1. Specifically, as illustrated in FIG. 7, the second RS encoder 103 generates Q inter-page Reed-Solomon parity frames S1 to SQ by dividing the first Reed-Solomon parity data RS1 input in units of frames by Q. Here, Q is a value (Q=LN_b/8(K-M)) obtained by dividing a total of the number of bits L×N_b of the first Reed-Solomon parity data RS1 by 8×(K-M). The denominator 8 is the number of bits constituting one symbol, K is the number of pages of one block (or the number of frames of the user data YD), and M is the number of frames of the second Reed-Solomon data frames U1 to UM constituting the second Reed-Solomon parity data RS2. Here, the number of bits of one symbol is not limited to the same number (8 bits) as the number of bits of each of symbols constituting the first Reed-Solomon parity data RS1 but may be a different number. Further, the number M of frames of the second Reed-Solomon data frames U1 to UM may be the same as the number L of frames of the first Reed-Solomon parity frames R1 to RL or may be a different number. For example, M may be equal to or less than L.

Further, in a case in which LN_b/8 (K-M) is not an integer, Q is replaced with an integer obtained by rounding up a decimal of LN_b/8 (K-M). At this time, bits or symbols that are insufficient due to rounding up may be compensated by, for example, zero padding or the like as illustrated in FIG. 7.

Then, the second RS encoder 103 generates the second Reed-Solomon parity data RS2 of a total of M×8×Q bits each configured with a parity of every M symbols for the first Reed-Solomon data frames T1 to T(K-M) extracted from the inter-page Reed-Solomon parity frames S1 to SQ by the number of bits of the encoding symbol unit (eight bits in this description). The generated second Reed-Solomon parity data RS2 includes M second Reed-Solomon data frames U1 to UM which are equal in number to the number of symbols as the first Reed-Solomon data frames T1 to T(K-M) in the intra-page direction. The second Reed-Solomon parity data RS2 generated by the second RS encoder 103 is stored in the parity buffer memory 104. As a result, the first Reed-Solomon parity data RS1 from the first RS encoder 102 and the second Reed-Solomon parity data RS2 from the second RS encoder 103 are stored in the parity buffer memory 104.

When the ECC encoder 105 executes the encoding, the user data YD is input from the write buffer memory 101 to the ECC encoder 105 in units of frames (the inter-page data frames F1 to F(N_b/8)) as illustrated in FIG. 4. Further, the first Reed-Solomon parity data RS1 and the second Reed-Solomon parity data RS2 in the parity buffer memory 104 are also input to the ECC encoder 105. Specifically, the first Reed-Solomon parity data RS1 and the second Reed-Solomon parity data RS2 in the parity buffer memory 124 are concatenated to generate final Reed-Solomon parity data RS3, and the final Reed-Solomon parity data RS3 is input to the ECC encoder 105 in units of frames (the first Reed-Solomon data frames T1 to T(K-M) and the second Reed-Solomon data frames U1 to UM).

The ECC encoder 105 generates the inline ECC parity IEP for each piece of frame data by performing the error correction coding on the frame data obtained by concatenating the user data YD input from the write buffer memory 101 with the final Reed-Solomon parity data RS3 input from the parity buffer memory 104 in units of frames using the BCH code, the LDPC code, or the like. Then, the ECC encoder 105 generates an ECC frame of each piece of frame data by concatenating the inline ECC parity IEP generated with each piece of frame data, and sequentially outputs the generated ECC frame to the memory I/F 13. On the other hand, the memory I/F 13 writes the ECC frame input from the ECC encoder 105 in a page corresponding to a designated physical address in the non-volatile memory 20 in accordance with an instruction from the control unit 11.

Figure 9:
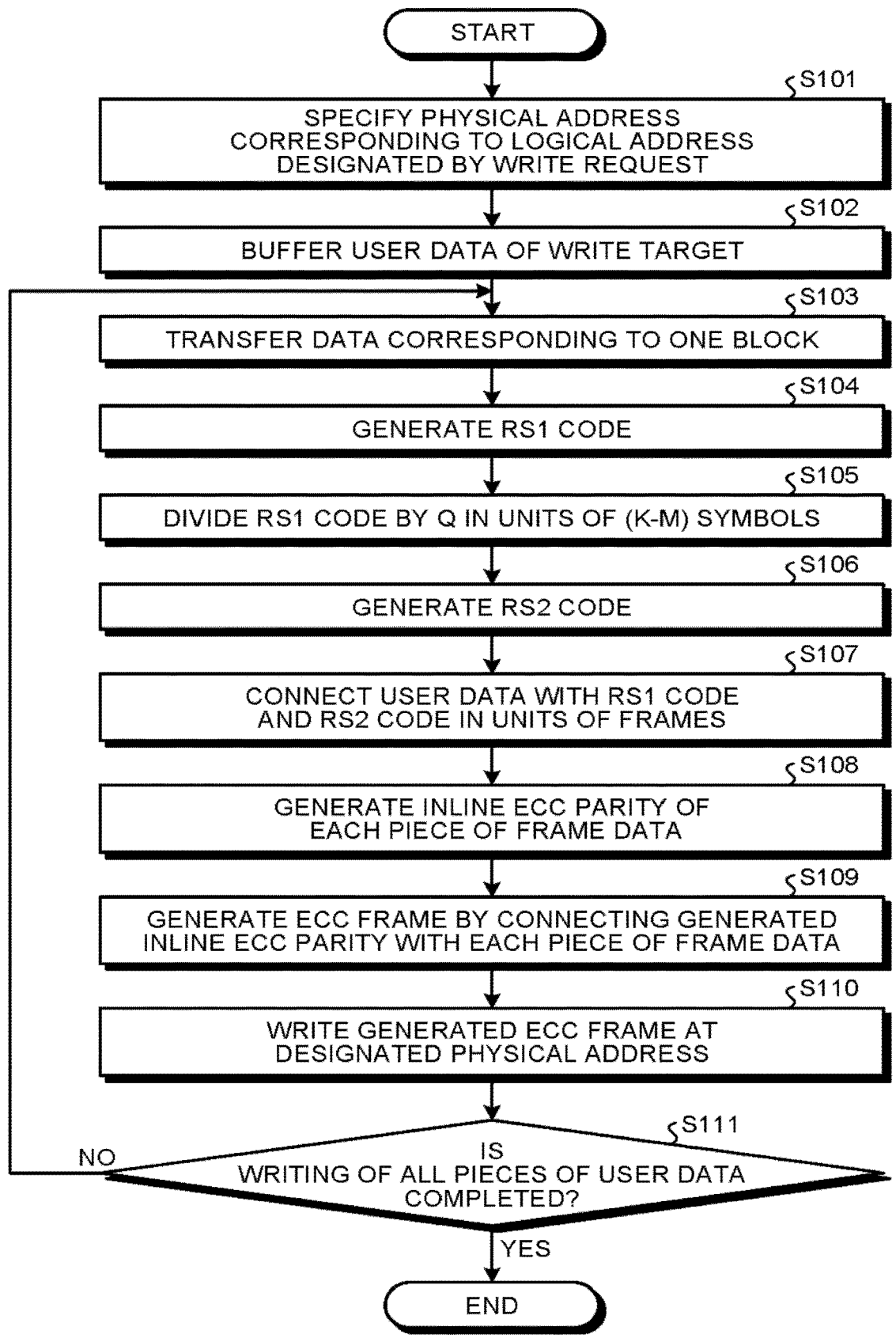
FIG. 9 is a flowchart illustrating a schematic example of a write operation according to the first embodiment.

Next, an operation at the time of writing according to the present embodiment will be described in detail with reference to the appended drawings. FIG. 9 is a flowchart illustrating a schematic example of a write operation according to the present embodiment. In FIG. 9, for the sake of simplicity, the first Reed-Solomon parity data RS1 is referred to as an RS1 code, and the second Reed-Solomon parity data RS2 is referred to as an RS2 code.

As illustrated in FIG. 9, in the present operation, first, the control unit 11 that has received the write request input via the host I/F 15 from the host 30 specifies a physical address corresponding to a logical address designated by the write request with reference to, for example, an address translation table (not illustrated) (Step S101). Further, the control unit 11 temporarily stores the user data YD of the write target input from the host 30 together with the write request in the data buffer (Step S102).

Next, the control unit 11 transfers the user data YD corresponding to one block from the data buffer 12 to the encoder 17 (Step S103). The user data YD corresponding to one block transferred to the encoder 17 is stored in the write buffer memory 101 (see FIG. 4). The user data YD corresponding to one block is assumed to include the K user data frames B1 to BK necessary when the first RS encoder 102 performs the encoding.

Then, in the encoder 17, the first RS encoder 102 receives the inter-page data frames F1 to F(N_b/8) of the user data YD from the write buffer memory 101 and generates the first Reed-Solomon parity data RS1 of a total of L×N_b bits each configured with a parity of every L symbols by performing the Reed-Solomon coding on the input inter-page data frames F1 to F(N_b/8) (Step S104). The generated first Reed-Solomon parity data RS1 is input to the second RS encoder 103 and stored in the parity buffer memory 104.

Then, the second RS encoder 103 generates the Q inter-page Reed-Solomon parity frames S1 to SQ by dividing the input first Reed-Solomon parity data RS1 by Q (Step S105). Then, the second RS encoder 103 generates the second Reed-Solomon parity data RS2 of a total of M×8×Q bits each configured with a parity of every M symbols by performing the Reed-Solomon coding on the first Reed-Solomon data frames T1 to T(K-M) extracted from the inter-page Reed-Solomon parity frames S1 to SQ by the number of bits of the encoding symbol unit (eight bits in this description) (Step S106). The generated second Reed-Solomon parity data RS2 is stored in the parity buffer memory 104.

Then, the ECC encoder 105 receives the user data YD in the write buffer memory 101 and the first Reed-Solomon parity data RS1 and the second Reed-Solomon parity data RS2 in the parity buffer memory 104, and generates the frame data by concatenating the input user data YD and the first Reed-Solomon parity data RS1 or the second Reed-Solomon parity data RS2 frame in units of frames (Step S107). Then, the ECC encoder 105 generates the inline ECC parity IEP for each piece of frame data by performing the error correction coding on the generated frame data using the BCH code, the LDPC code, or the like (Step S108). Then, the ECC encoder 105 generates the ECC frame by concatenating the generated inline ECC parity IEP with each piece of frame data (Step S109).

The ECC frame generated accordingly is input to the memory I/F 13. In accordance with the instruction from the control unit 11, the memory I/F 13 writes the ECC frame input from the ECC encoder 105 in the page corresponding to the designated physical address in the non-volatile memory (Step S110).

Thereafter, the control unit 11 determines whether or not all pieces of the user data YD temporarily held in the data buffer 12 are completely written in the non-volatile memory 20 (Step S111), and when all pieces of the user data are completely written (YES in Step S111), the present operation ends. On the other hand, when any one piece of user data is not written (NO in Step S111), the process returns to Step S103, and a subsequent operation is executed.

Figure 10:
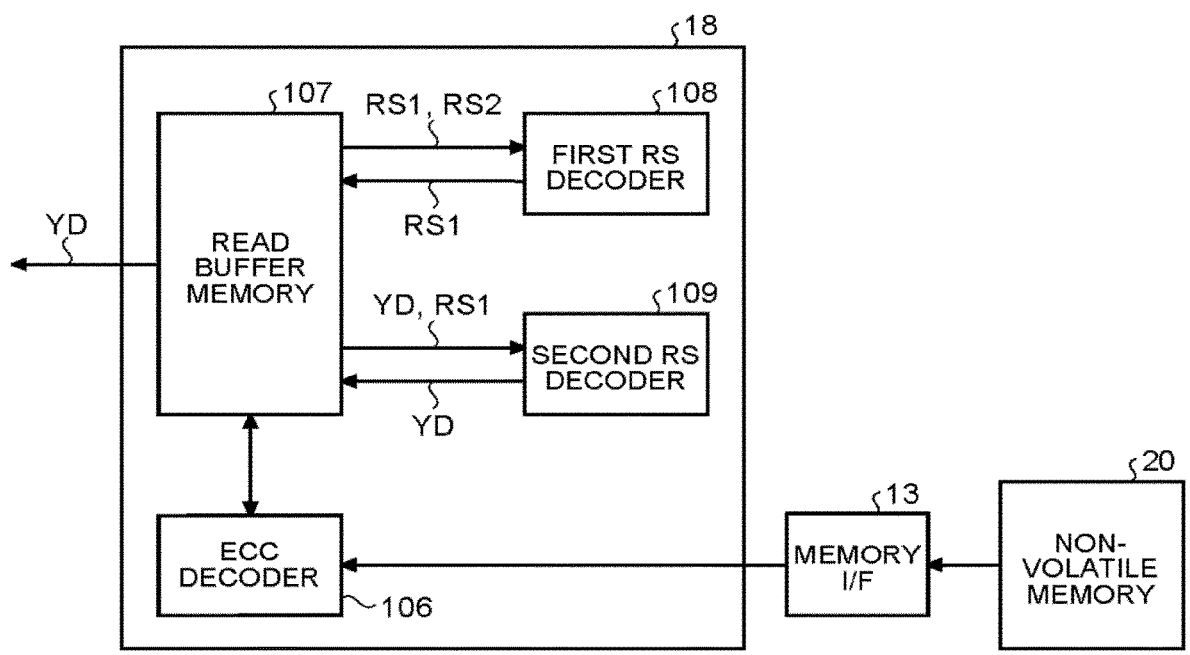
FIG. 10 is a block diagram illustrating a schematic configuration example of a decoder according to the first embodiment.
Figure 11:
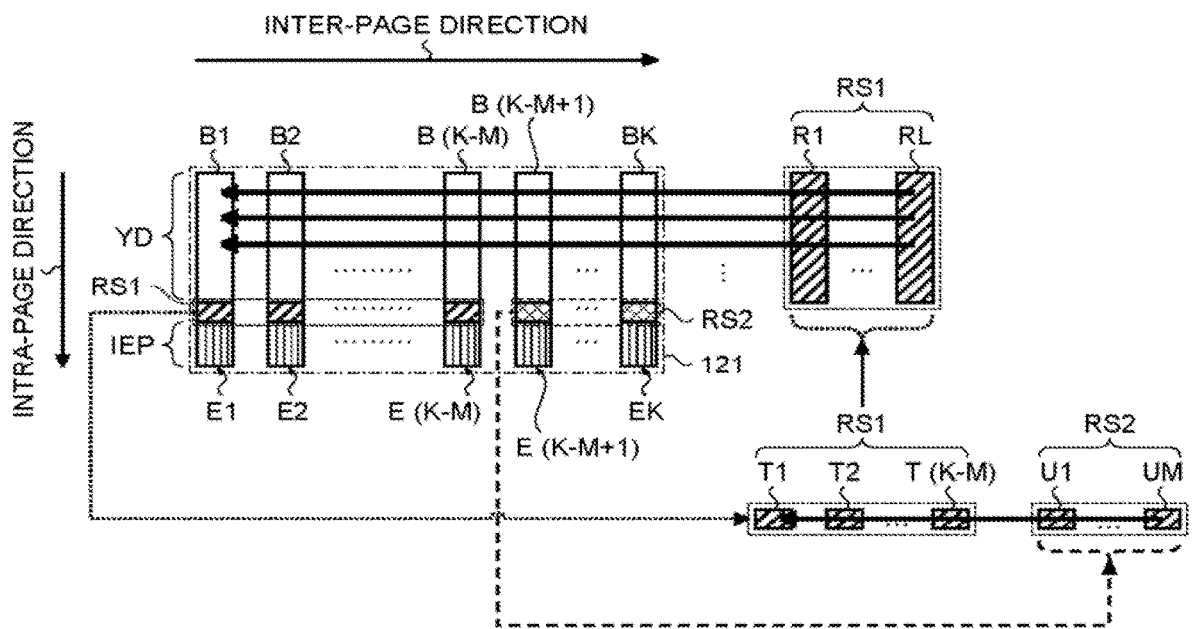
FIG. 11 is a diagram for describing the flow of decoding by a decoder according to the first embodiment.
Figure 12:
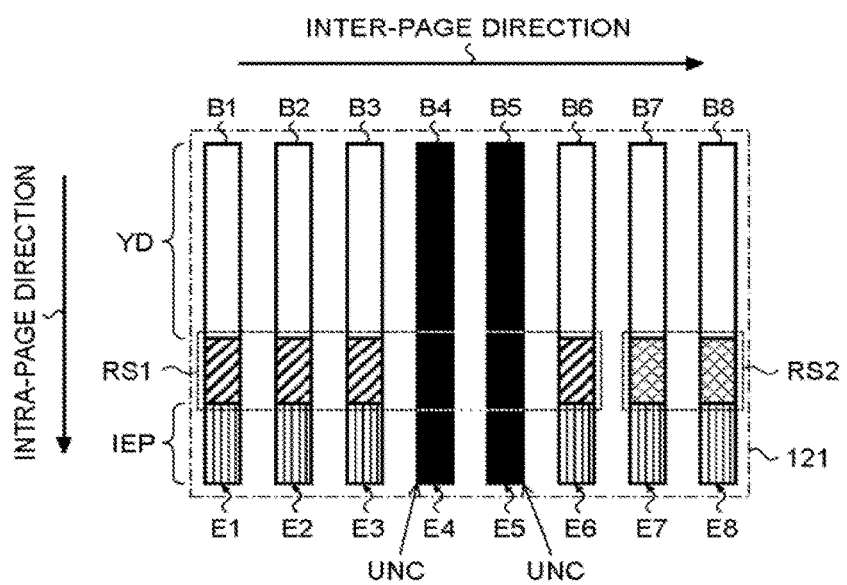
FIG. 12 is a diagram for describing using a specific example of the flow of decoding by a decoder according to the first embodiment (1/3)
Figure 13:
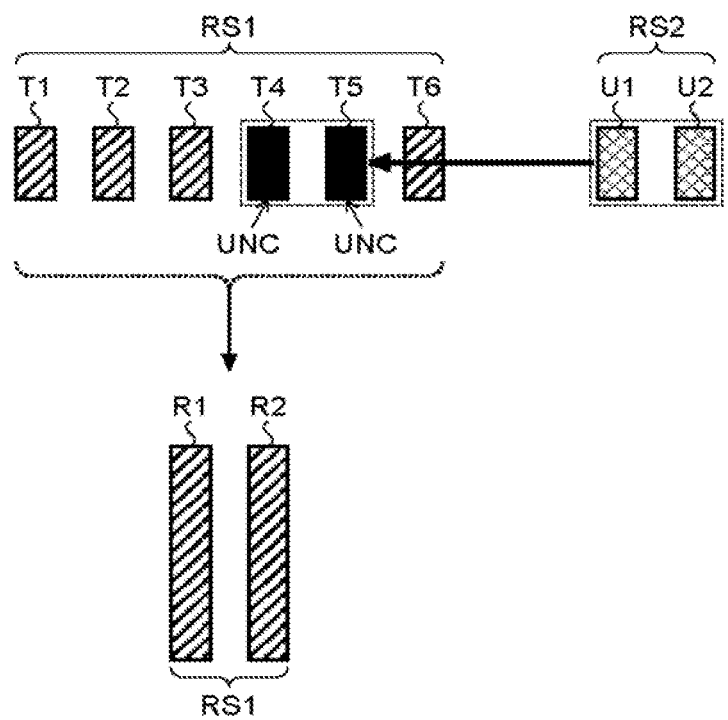
FIG. 13 is a diagram for describing using a specific example of the flow of decoding by a decoder according to the first embodiment (2/3)
Figure 14:
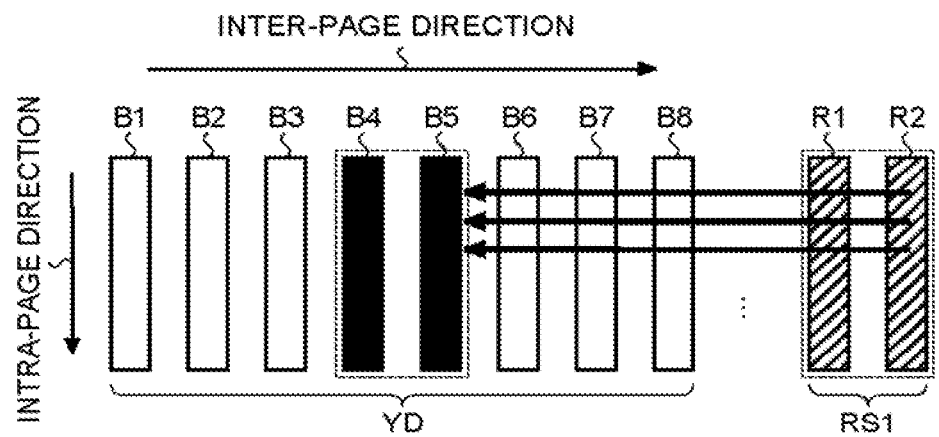
FIG. 14 is a diagram for describing using a specific example of the flow of decoding by a decoder according to the first embodiment (3/3)

Then, the decoder 18 (see FIG. 1) according to the present embodiment will be described in detail with reference to the appended drawings. FIG. 10 is a block diagram illustrating a schematic configuration example of the decoder according to the present embodiment. FIG. 11 is a diagram for describing the flow of decoding by the decoder according to the present embodiment. FIGS. 12 to 14 are diagrams for describing using a specific example of the flow of decoding by the decoder according to the present embodiment.

As illustrated in FIG. 10, the decoder 18 includes an ECC decoder 106, a read buffer memory 107, a first RS decoder 108, and a second RS decoder 109.

In accordance with the instruction from the control unit 11, the memory I/F 13 reads target data from the non-volatile memory 20, and inputs the read data which is accordingly read to the ECC decoder 106. As illustrated in FIG. 11, the read data includes K read ECC frames E1 to EK corresponding to the ECC frames at the time of writing. Similarly to the ECC frames at the time of writing, each of the read ECC frames E1 to EK includes the user data YD, the first Reed-Solomon parity data RS1 and/or the second Reed-Solomon parity data RS2, and the inline ECC parity IEP.

The ECC decoder 106 performs the error correction process using each inline ECC parity IEP on each of the input read ECC frames E1 to EK and inputs the obtained read data which has undergone the error correction process to the read buffer memory 107. In a case in which there is a symbol on which the error correction is unable to be performed by the error correction process using the inline ECC parity IEP, information identifying the read ECC frame including the symbol is stored in, for example, a predetermined region in the read buffer memory 107 or a memory (not illustrated).

The read buffer memory 107 holds the read data which has undergone the error correction process (and the information identifying the read ECC frame including the symbol on which the error correction is unable to be performed), and executes an input and output of necessary data to/from the ECC decoder 106, the first RS decoder 108, and the second RS decoder 109.

Here, in a case in which an error symbol is not included in the read data which has undergone the error correction using the inline ECC parity IEP, that is, in a case in which an original ECC frame can be restored by the error correction using the inline ECC parity IEP, the user data YD which is the write data is restored in the read buffer memory 107. The user data YD restored as described above is temporarily held in, for example, the data buffer 12 or the like and then transmitted to the host 30 via the host I/F 15.

On the other hand, there is an error symbol on which the error correction is unable to be performed as in the case in which the read ECC frame is lost, and in a case in which the number of read ECC frames including the error symbols on which the error correction is unable to be performed is equal to or less than M which is the number of error symbols which are correctable using the second Reed-Solomon parity data RS2, the error correction is performed on the first Reed-Solomon parity data RS1 included in the read data in the read buffer memory 107 using the second Reed-Solomon parity data RS2 which is also included in the read data in the read buffer memory 107.

More specifically, the first Reed-Solomon parity data RS1 and the second Reed-Solomon parity data RS2 included in the read ECC frames E1 to EK in the read buffer memory 107 and the information identifying the read ECC frame including the symbol on which the error correction is unable to be performed are input to the first RS decoder 108. The first RS decoder 108 performs the error correction on the first Reed-Solomon data frames T1 to T(K-M) of the read ECC frame including the error symbol using the second Reed-Solomon parity data RS2 on the basis of the information identifying the read ECC frame including the symbol on which the error correction is unable to be performed. Then, the second RS decoder 109 performs the error correction on the user data frame of the read ECC frame including the error symbol using the first Reed-Solomon parity data RS1 which has undergone the error correction. Is a result, the user data YD which is the write data is restored in the read buffer memory 107.

This will be described with reference to a specific example illustrated in FIGS. 12 to 14. In the example illustrated in FIGS. 12 to 14, the read data which has undergone the error correction process includes eight read ECC frames E1 to E8, the first Reed-Solomon parity data RS1 is included in the six read ECC frames E1 to E6 among the eight read ECC frames E1 to E8, and the second Reed-Solomon parity data RS2 is included in the remaining two read ECC frames E7 and E8. In other words, in the example illustrated in FIGS. 12 to 14, the second Reed-Solomon parity data RS2 includes two second Reed-Solomon data frames U1 and U2. In this case, the M number of error symbols correctable by the second Reed-Solomon parity data RS2 is two. In the examples illustrated in FIGS. 12 to 14, the two read ECC frames E4 and E5 among the eight read ECC frames E1 to E8 are read ECC frames including the error symbol. In the examples illustrated in FIGS. 12 to 14, the number L of error symbols correctable by the first Reed-Solomon parity data RS1 is assumed to be two.

In the case illustrated in FIGS. 12 to 14, as illustrated in FIG. 13, among the read ECC frames E1 to E8 in the read buffer memory 107, first Reed-Solomon data frames T1 to T6 constituting the first Reed-Solomon parity data RS1 and second Reed-Solomon data frames U1 and U2 constituting the second Reed-Solomon parity data RS2 are input to the first RS decoder 108. Further, information identifying the read ECC frames E4 and E5 including the symbol on which the error correction is unable to be performed is also input to the first RS decoder 108. The first RS decoder 106 performs the error correction using the second Reed-Solomon data frames U1 and U2 on the input first Reed-Solomon data frames T1 to T8 on the basis of the information identifying the read ECC frames E4 and E5 including the symbol on which the error correction is unable to be performed. As a result, the error correction is performed on the first Reed-Solomon data frames T4 and T5 corresponding to the read ECC frames E4 and E5 including the symbol on which the error correction is unable to be performed. Then, the first RS decoder 108 updates the first Reed-Solomon parity data RS1 in the read ECC frames E1 to E6 in the read buffer memory 107 by the first Reed-Solomon parity data RS1 configured with the first Reed-Solomon data frames T1 to T6 including no error symbol.

If the first Reed-Solomon parity data RS1 in the read buffer memory 107 is corrected as described above, the user data frames B1 to BK constituting the user data YD in the read buffer memory 107 and the first Reed-Solomon data frames T1 to T6 similarly constituting the first Reed-Solomon parity data RS1 in the read buffer memory 107 are input to the second RS decoder 109. Further, the information identifying the read ECC frames E4 and E5 including the symbol on which the error correction is unable to be performed is also input to the second RS decoder 109. The second RS decoder 109 generates the first Reed-Solomon parity frames R1 and R2 by reconstructing the error-corrected first Reed-Solomon data frames T1 to T6. Then, the second RS decoder 109 performs the user data frames B1 to BK using the generated first Reed-Solomon parity frames R1 and R2 on the basis of the information identifying the read ECC frames E4 and E1 including the symbol on which the error correction is unable to be performed. As a result, the user data YD which is the write data is restored in the read buffer memory 107.

Further, in a case in which the number of read ECC frames including the error symbol on which the error correction is unable to be performed is larger than M which is the number of error symbols correctable using the second Reed-Solomon parity data RS2 and L which is the number of error symbols correctable using the first Reed-Solomon parity data RS1, it may be possible to restore the user data YD which is the write data by repetitively executing the error correction using the first Reed-Solomon parity data RS1 and the error correction using the inline ECC parity IEP alternately.

In this regard, in the present embodiment, in a case in which the number of read ECC frames including the error symbol on which the error correction is unable to be performed is larger than M or L, the error correction of the first Reed-Solomon parity data RS1 using the second Reed-Solomon parity data RS2 by the first RS decoder 108 and the error correction of the user data YD using the first Reed-Solomon parity data RS1 by the second RS decoder 109 and the error correction using the inline ECC parity IEP by the ECC decoder 106 are repetitively executed on the read data in the read buffer memory 107 alternately. Such repetitive error correction is continued, for example, until the user data YD is successfully restored. However, in order to prevent an increase in the latency for the read request from the host 30, an upper limit may be set for the number of repetitions.

Figure 15:
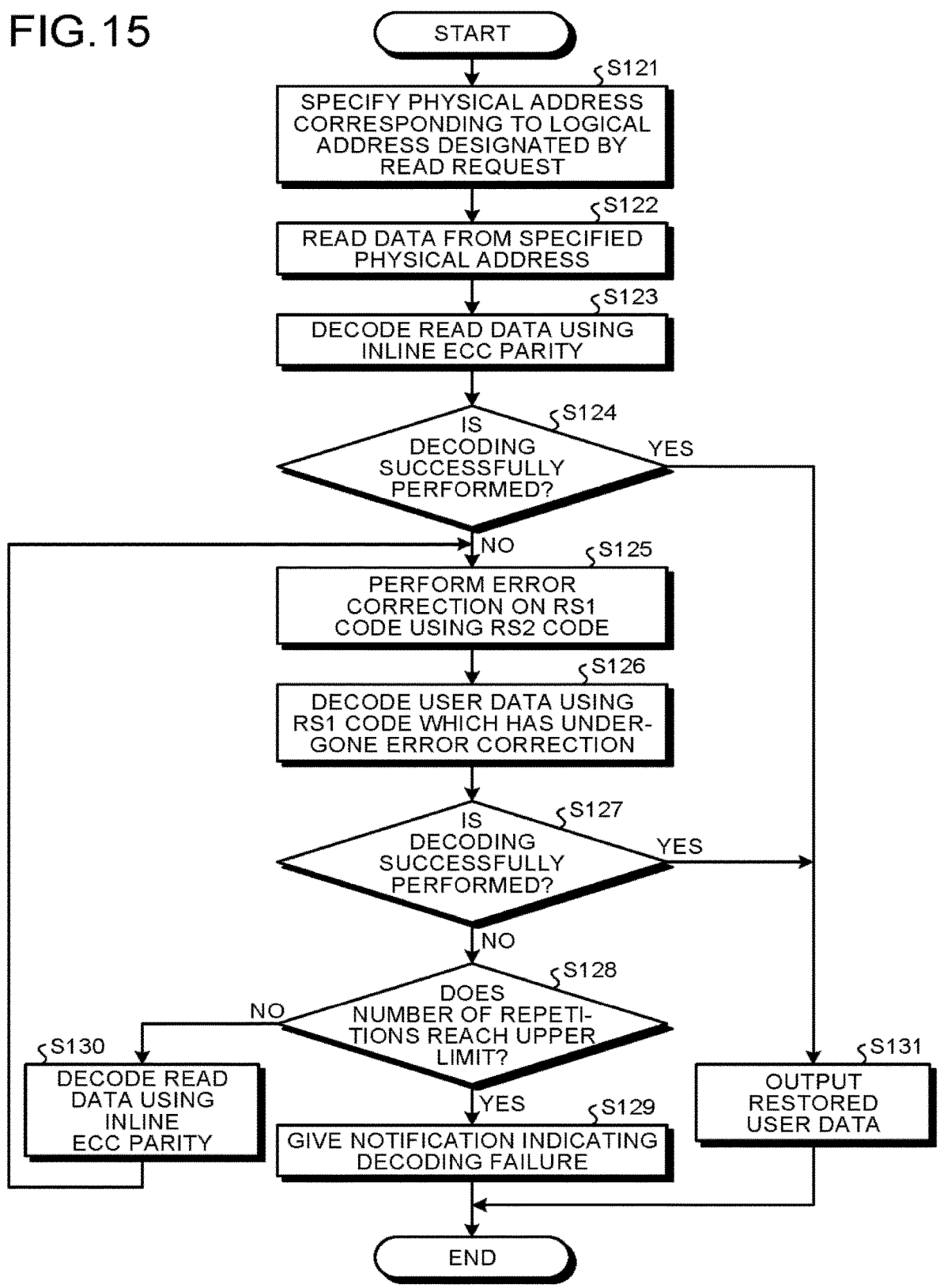
FIG. 15 is a flowchart illustrating a schematic example of a read operation according to the first embodiment.

Then, an operation at the time of reading according to the present embodiment will be described in detail with reference to the appended drawings. FIG. 15 is a flowchart illustrating a schematic example of the read operation according to the present embodiment. In FIG. 15, for the sake of simplicity, the first Reed-Solomon parity data is referred to as an RS1 code, and the second Reed-Solomon parity data is referred to as an RS2 code.

As illustrated in FIG. 15, in the present operation, first, the control unit 11 that has received the read request input via the host I/F 15 from the host 30 specifies a physical address corresponding to a logical address designated by the read request with reference to, for example, an address translation table (not illustrated) (Step S121). Then, the control unit 11 instructs the memory I/F 13 to read the data from the specified physical address, so that the data of the read target is read from the specified physical address by the memory I/F 13 (Step S122).

The read data read by the memory I/F 13 is input to the ECC decoder 106, for example, in units of read ECC frames. The ECC decoder 106 performs decoding using each inline ECC parity IEP on each input read ECC frame (Step S123), and sequentially stores the read ECC frame obtained as a decoding result in the read buffer memory 107. Accordingly, the read data which has undergone the error correction using the inline ECC parity IEP is stored in the read buffer memory 107. Then, the ECC decoder 106 determines whether or not the decoding of the user data YD is successfully performed (Step S124).

If the decoding is successfully performed in Step S123 (YES in Step S124), the decoder 18 outputs the user data YD in the read buffer memory 107 (Step S131). The output the user data YD is temporarily held in, for example, the data buffer 12 (see FIG. 1) and then transferred to the host 30 via the host I/F 15. On the other hand, if the decoding is not successfully performed (NO in Step S124), the first Reed-Solomon parity data RS1 and the second Reed-Solomon parity data RS2 in the read buffer memory 107 and the information identifying the read ECC frame including the symbol on which the error correction is unable to be performed are input to the first RS decoder 108, and the first RS decoder 108 performs the error correction of the first Reed-Solomon parity data RS1 using the second Reed-Solomon parity data RS2 (Step S125). With this error correction, the first Reed-Solomon parity data RS1 in the read buffer memory 107 is rewritten with the first Reed-Solomon parity data RS1 which has undergone the error correction.

Then, the first Reed-Solomon parity data RS1 which has undergone the error correction and the user data YD in the read buffer memory 107 and the information identifying the read ECC frame including the symbol on which the error correction is unable to be performed are input to the second RS decoder 109, and the second RS decoder 109 decodes the user data YD using the first Reed-Solomon parity data RS1 which has undergone the error correction (Step S126). Then, the second RS decoder 109 determines whether or not the decoding of the user data YD is successfully performed (Step S127). With the decoding in Step S126, the user data YD in the read buffer memory 107 is rewritten with the user data YD which has undergone the error correction.

If the decoding is successfully performed in Step S126 (YES in Step S127), the decoder 18 proceeds to Step S131, and the user data YD in the read buffer memory 107 is output as described above. On the other hand, if the decoding is not successfully performed (NO in Step S127), the decoder 18 determines whether or not the number of repetitions of the decoding using the first Reed-Solomon parity data RS1 and the second Reed-Solomon parity data RS2 and the decoding using the inline ECC parity IEP reaches a preset upper limit (Step S128). When the number of repetitions reaches the upper limit (YES in Step S128), the decoder 18 gives a notification indicating a decoding failure to, for example, the control unit 11 (Step S129), and the present operation ends. Further, the control unit 11 which has received the notification indicating a decoding failure transmits a read error to, for example, the host 30. On the other hand, when the number of repetitions does not reach the upper limit (NO in Step S128), the read data in the read buffer memory 107 is again input to the ECC decoder 106, for example, in the units of read ECC frames, and the ECC decoder 106 decodes each input read ECC frame using the inline ECC parity IEP (Step S130). The read ECC frame obtained as a decoding result of Step S130 is sequentially stored in the read buffer memory 107.

Thereafter, the present operation returns to Step S125, and thereafter the error correction of the first Reed-Solomon parity data RS1 using the second Reed-Solomon parity data RS2 (Step S125), the decoding of the user data YD using the first Reed-Solomon parity data RS1 which has undergone the error correction (Step S126), and the decoding of the user data YD using the inline ECC parity IEP which has undergone the error correction (Step S130) are repetitively performed until the decoding of the user data YD is successfully performed (YES in Step S127) or until the number of repetitions reaches the upper limit (YES in Step S128).

As described above, according to the present embodiment, the first Reed-Solomon parity data RS1 and the second Reed-Solomon parity data RS2 generated for the user data YD written in each block BLK are stored in the same block BLK as each piece of user data YD. Accordingly, it is possible to implement the memory system that enables the error correction in the inter-page direction while reducing the number of pages or blocks to be secured for redundant data.

Second Embodiment

Next, a memory system and a control method according to the second embodiment will be described in detail with reference to the appended drawings. The write operation including the encoding process described in the first embodiment is not limited to the write operation executed in accordance to the write request from the host 30 and can be applied to, for example, a write operation for a write request generated in execution of an event such as garbage collection occurring in the memory system 1 or refreshing. In this regard, in the present embodiment, an example in which different write operations are executed in a write operation when a write request is received from the host 30 and a write operation for a write request generated in execution of an event occurring in the memory system 1 will be described.

In the following description, the garbage collection is described as an example of an event occurring in the memory system 1, but the event is not limited to this example and may be various events associated with execution of a write operation in a state in which data corresponding to one block is prepared as data of a write target in advance such as refreshing. In the present embodiment, for the sake of clarification, a write operation when the write request is received from the host 30 is referred to as a write operation in a first write mode, and a write operation for a write request occurring in execution of the garbage collection is referred to as a write operation in a second write mode. The write operation in the first write mode may be, for example, a normal write operation. On the other hand, the write operation in the second write mode is the write operation described in the first embodiment. Further, in the following description, for configurations and operations similar to the configurations and operations in the first embodiment, the configurations and the operations described above are referred to, and thus duplicate description will be omitted.

The memory system according to the present embodiment may have a configuration similar to the memory system 1 described above with reference to FIG. 1 in the first embodiment. Here, in the present embodiment, the schematic configuration for executing the write operation and the read operation is like the block configuration illustrated in FIG. 16.

Figure 16:
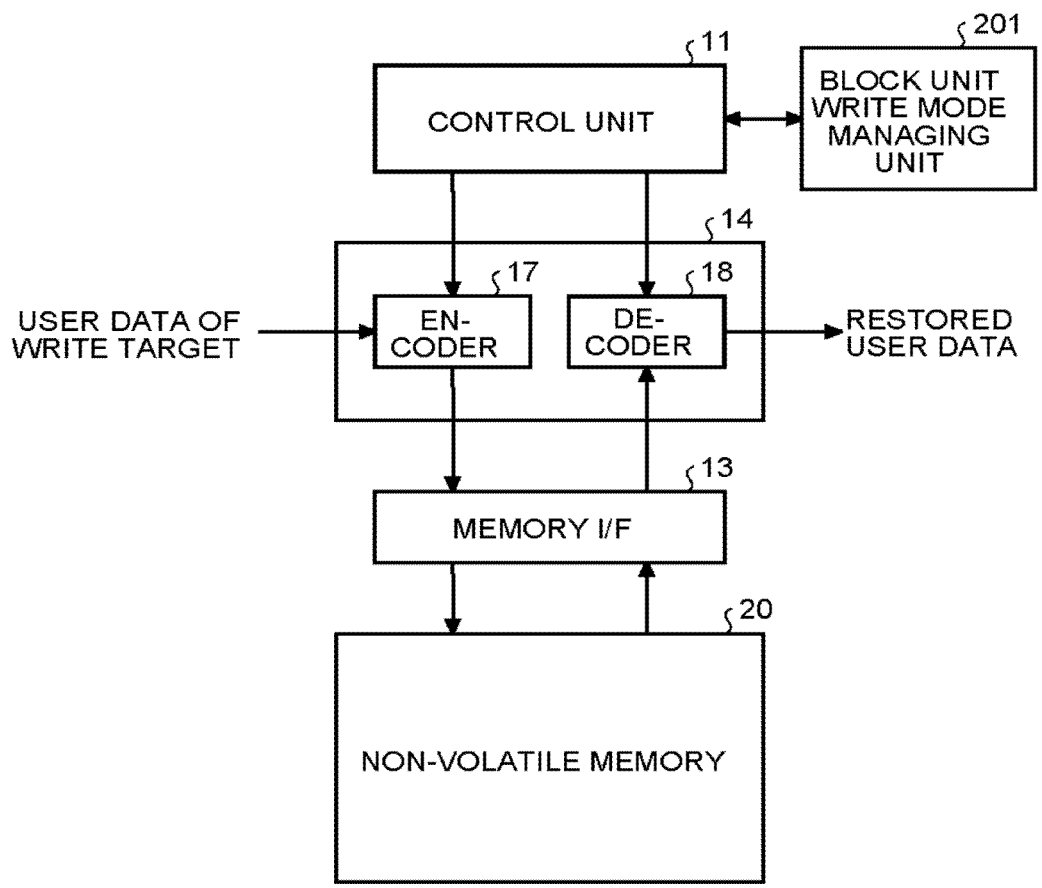
FIG. 16 is a block diagram illustrating a schematic example of a configuration for executing a write operation and a read operation according to a second embodiment.

As illustrated in FIG. 16, the memory system according to the present embodiment includes a control unit 11, an encoding/decoding unit 14, a memory I/F 13, a non-volatile memory 20, and a block unit write mode managing unit 201. Among these units, the control unit 11, the encoding/decoding unit 14, the memory I/F 13, and the non-volatile memory 20 may be similar to those illustrated in FIG. 1.

For example, the block unit write mode managing unit 201 is constituted by some regions in a RAM or the non-volatile memory 20, and manages a write mode in which writing is performed on each block BLK of the non-volatile memory 20 in either the first write mode and the second write mode. In this regard, the block unit write mode managing unit 201 manages identification information identifying the first write mode and the second write mode, for example, in association with a physical address identifying each block BLK.

Figure 17:
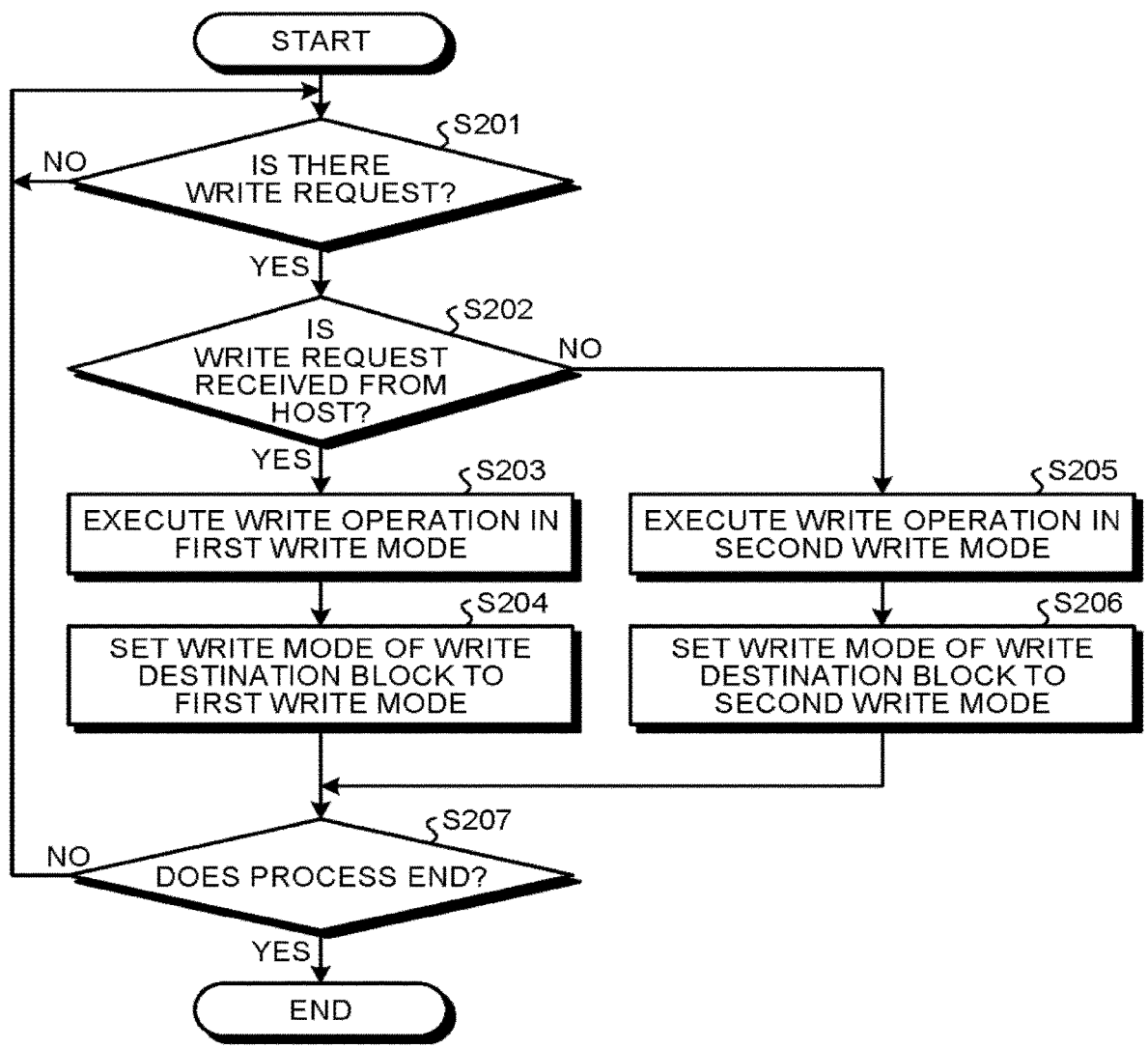
FIG. 17 is a flowchart illustrating an example of a main flow of an operation at the time of writing according to the second embodiment.

FIG. 17 is a flowchart illustrating an example of a main flow of an operation at the time of writing according to the present embodiment. FIG. 17 is a flowchart illustrating an example of the write operation in the second write mode according to the present embodiment.

As illustrated in FIG. 17, in the present embodiment, for example, the control unit 11 is on standby for the write request (NO in Step S201). As described above, in this description, the write request is a write request from the host 30 or a write request occurring during execution of the garbage collection.

In a case in which there is a write request (YES in Step S201), the control unit 11 determines whether or not the write request is a write request front the host 30 (Step S202). In a case in which the write request is a write request from the host 30 (YES in Step S202), the control unit 11 instructs the encoding/decoding unit 14 and the memory I/F 13 to perform the write operation in the first write mode, so that the write operation in the first write mode is executed (Step S203). In the write operation in the first write mode, for example, the encoder 17 generates the error correction code described above with reference to FIG. 2. The memory I/F 13 writes the error correction code generated by the encoder 17 in a page specified by a physical address corresponding to a logical address specified by the write request. Then, the control unit 11 performs a setting indicating that the write mode of the block BLK serving as the write destination is the first mode in the block unit write mode managing unit 201 (Step S204), and the process proceeds to Step S207.

On the other hand, in a case in which the write request is not a write request from the host 30 (NO in Step S202), that is, in a case in which the write request is a write request occurring in the execution of the garbage collection, the control unit 11 instructs the encoding/decoding unit 14 and the memory I/F 13 to perform the write operation in the second write mode, so that the write operation in the second write mode is executed (Step S205). In the write operation in the second write mode, for example, in the garbage collection, a block serving as a valid data collection target (hereinafter referred to as a transcription source block) and a block serving as a transcription destination of the collected valid data (hereinafter referred to as a transcription destination block) are specified, and an operation similar to the write operation described above with reference to FIG. 9 in the first embodiment is executed on the valid data corresponding to one block collected from the transcription source block. Then, the control unit 11 performs a setting indicating that the write mode of the transcription destination block is the second write mode in the block unit write mode managing unit 201 (Step S206) and the process proceeds to Step S207.

In Step S207, for example, it is determined whether or not the control unit 11 ends the present operation, and in a case in which the control unit 11 ends the present operation (YES in Step S207), the present operation ends. On the other hand, in a case in which the control unit 11 does not end the present operation (NO in Step S207), the present operation returns to Step S201.

As described above, according to the present embodiment, in a case in which data corresponding to one block is prepared, the write operation in the second write mode described in the first embodiment is executed, and in a case in which data corresponding to one block is not prepared, for example, the write operation in the first write mode which is a normal operation is executed. Accordingly, it is not necessary to be on standby for writing to the non-volatile memory 20 until the user data YD corresponding to one block is secured in the data buffer 12, and thus it is possible to perform the write process more quickly.

Since the other configurations, operations, and effects are similar to those described above, detailed description thereof will be omitted here.

Third Embodiment

Next, a memory system and a control method according to the third embodiment will be described in detail with reference to the appended drawings. Further, in the following description, for configurations and operations similar to the configurations and operations in the first embodiment, the configurations and the operations described above are referred to, and thus duplicate description will be omitted.

In the write operation including the encoding process described in the first and second embodiments, the first Reed-Solomon parity data RS1 and the second Reed-Solomon parity data RS2 generated for the user data YD written in each block BLK are stored in the same block BLK as each piece of user data YD. On the other hand, in the third embodiment, the first Reed-Solomon parity data RS1 and the second Reed-Solomon parity data RS2 generated for the user data YD written in each block BLK are stored in a block BLK different from the block BLK in which the user data YD is stored. This will be described using an example of FIG. 18.

Figure 18:
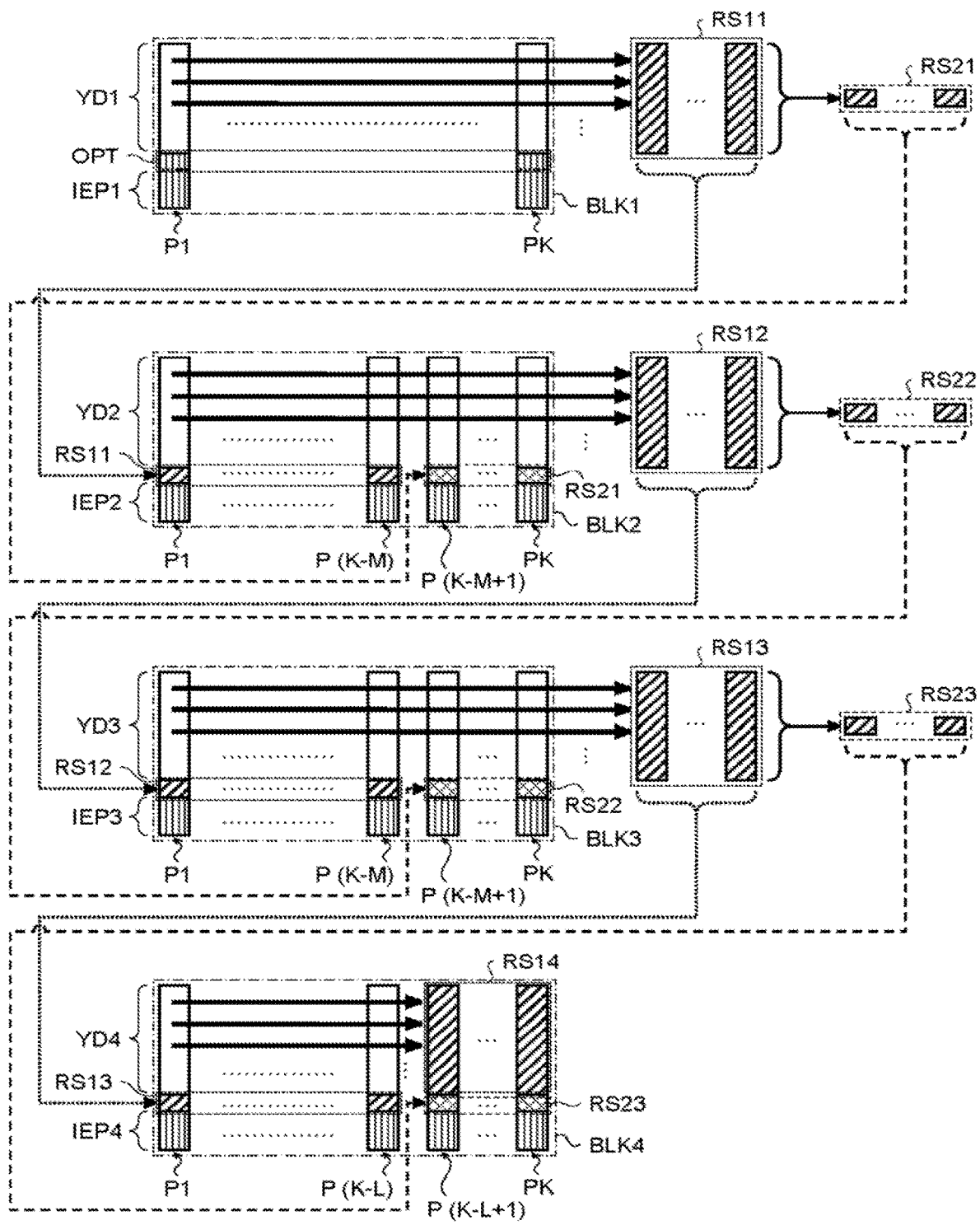
FIG. 18 is a flowchart illustrating an example of a write operation in a second write mode according to a third embodiment.

FIG. 18 illustrates an example in which the user data YD is sequentially written in four blocks BLK1 to BLK4. As illustrated in FIG. 18, in the present embodiment, for user data YD1 stored in the first block BLK1, first Reed-Solomon parity data RS11 and second Reed-Solomon parity data RS21 are generated in the same manner as in the first embodiment. Here, in the third embodiment, the first Reed-Solomon parity data RS11 and the second Reed-Solomon parity data RS21 generated for the user data YD1 are stored in the next block BLK2, rather than the same block BLK1 as the user data YD1. Similarly, first Reed-Solomon parity data RS12 and second Reed-Solomon parity data RS22 generated for user data YD2 stored in the block BLK2 are also stored in the next block BLK3, and first Reed-Solomon parity data RS13 and second Reed-Solomon parity data RS23 generated for user data YD3 stored in the block BLK3 are also stored in the next block BLK4. Here, for user data YD4 stored in the last block BLK4, first Reed-Solomon parity data RS14 is generated, for example, similarly to the error correction code described above with reference to FIG. 2 and the first Reed-Solomon parity data RS14 is stored in the pages P(K-L+1) to PK secured separately from the user data YD4 in the same block BLK4 as the user data YD4.

As described above, in the present embodiment, encoding similar to the encoding described above with reference to FIG. 3 in the first embodiment (corresponding to the second write mode in the second embodiment) is executed on the user data YD stored in the block BLK other than the last block, and the first Reed-Solomon parity data RS1 and the second Reed-Solomon parity data RS2 generated accordingly are stored in the next block BLK. On the other hand, encoding similar to the encoding described above with reference to FIG. 2 in the first embodiment (corresponding to the first write mode in the second embodiment) is executed on the user data YD stored in the last block BLK, and the first Reed-Solomon parity data RS1 generated accordingly is stored in the dedicated page secured in the last block BLK4.

The last block BLK may be, for example, the block BLK selected a write destination when the power of the memory system or a connection between the memory system and the host 30 is turned off.

Further, in a case in which the data length of the user data YD allocated to each of the pages P1 to PK between the first block BLK and the second or later block BLK does not change, a free space OPT corresponding to the first Reed-Solomon data frames U1 to T(K-M) or the second Reed-Solomon data frames U1 to UM occurs in the ECC frame stored in each of the pages E1 to PK of the first block PLK. In this regard, in the present embodiment, dummy data of a specific value may be stored in the free space OPT, or the free space OPT may be filled by increasing the parity length of the inline ECC parity IEP generated for the user data YD stored in the first block BLK by the free space OPT.

The memory system according to the present embodiment as described above may have a configuration similar to the memory system 1 described in the first embodiment with reference to FIG. 1. Further, a schematic configuration for executing the write operation and the read operation may be similar to the block configuration illustrated in FIG. 16 in the second embodiment. Here, in the present embodiment, the encoder 17 can be replaced with an encoder 27 illustrated in FIG. 19.

Figure 19:
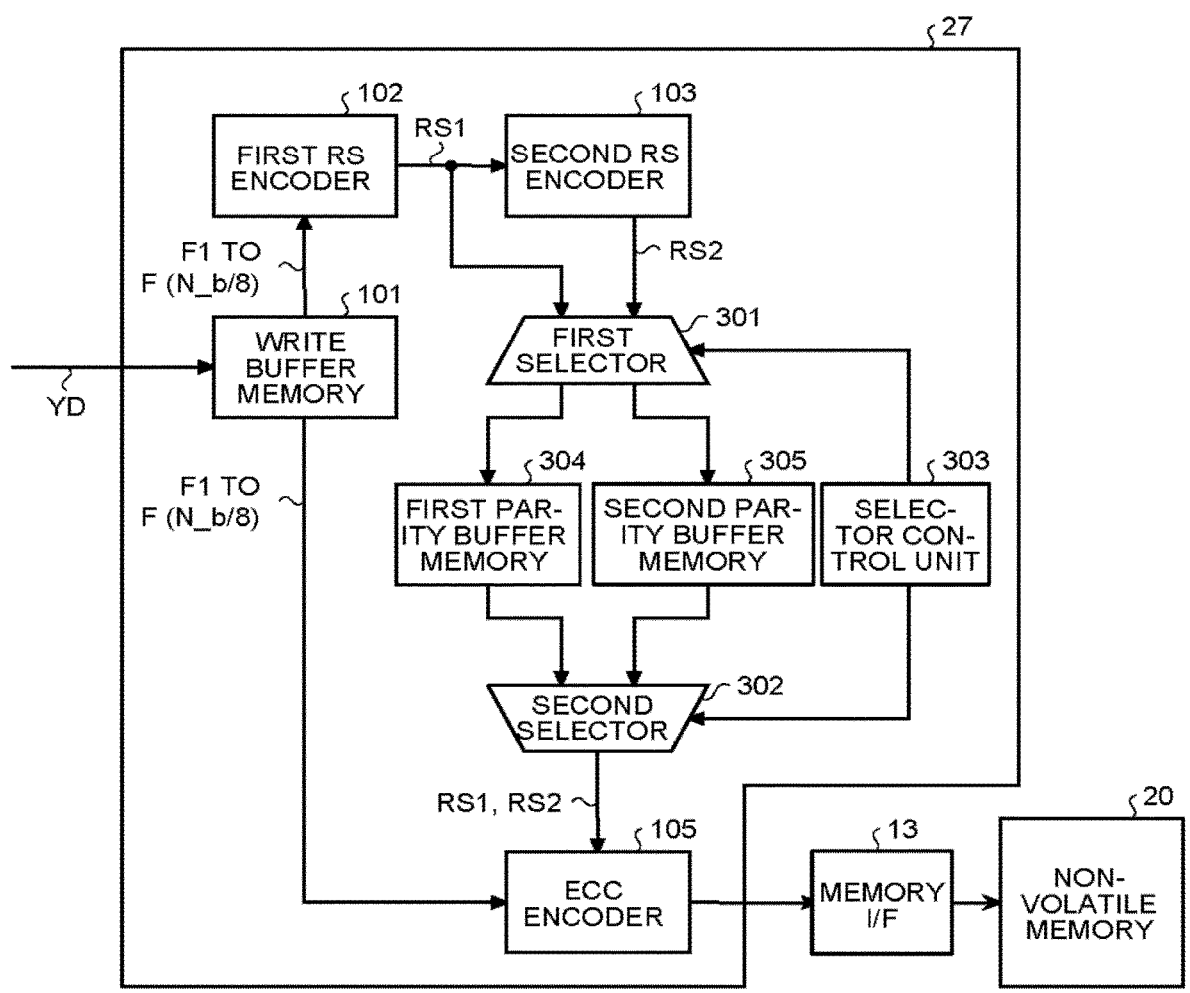
FIG. 19 is a block diagram illustrating a schematic configuration example of an encoder according to the third embodiment.

As illustrated in FIG. 19, the encoder 27 has a configuration similar to the configuration of the encoder 17 illustrated in FIG. 4 except that the parity buffer memory 104 is replaced with a first selector 301, a second selector 302, a selector control unit 303, a first parity buffer memory 304, and a second parity buffer memory 305.

Similarly to the parity buffer memory 104 in the first embodiment, the first parity buffer memory 304 and the second parity buffer memory 305 temporarily store the first Reed-Solomon parity data RS1 input from the first RS encoder 102 via the first selector 301 and the second Reed-Solomon parity data RS2 input from the second RS encoder 103 via the first selector 301, respectively. Further, the first parity buffer memory 304 and the second parity buffer memory 305 input the held first Reed-Solomon parity data RS1 and the second Reed-Solomon parity data RS2 to the ECC encoder 105 via the second selector 302, respectively.

The selector control unit 303 includes, for example, a counter (not illustrated), a flag memory, or the like, and alternately selects the first parity buffer memory 304 and the second parity buffer memory 305 as an output destination of the first selector 301 on the basis of a count value of the counter, a flag state of the flag memory, or the like. Similarly, the selector control unit 303 alternately selects the first parity buffer memory 304 and the second parity buffer memory 305 as an input source of the second selector 302 on the basis of, for example, the count value of the counter, the flag state of the flag memory, or the like.

As a specific example, the selector control unit 303 controls the first selector 301 such that the first Reed-Solomon parity data RS1 and the second Reed-Solomon parity data RS2 generated for the user data YD stored in the block BLK used at odd-number times are input to the first parity buffer memory 304, and the first Reed-Solomon parity data RS1 and the second Reed-Solomon parity data RS2 generated for the user data YD stored in the block BLK used at even-numbered times are input to the first parity buffer memory 304.

On the other hand, the selector control unit 303 controls the second selector 302 such that the first Reed-Solomon parity data RS1 and the second Reed-Solomon parity data RS2 held in the second parity buffer memory 305 are input to the ECC encoder 105 when the ECC frame to be stored in the block BLK used at odd-numbered times is generated, and the first Reed-Solomon parity data RS1 and the second Reed-Solomon parity data RS2 held in the first parity buffer memory 304 are input to the ECC encoder 105 when the ECC frame to be stored in the block BLK used at even-numbered times is generated.

As described above, by alternately switching the first parity buffer memory 304 and the second parity buffer memory 305, it is possible to store the first Reed-Solomon parity data RS1 and the second Reed-Solomon parity data RS2 generated for the user data YD written in each block BLK in the block BLK next to the block BLK in which the user data YD is stored. The first Reed-Solomon parity data RS1 and the second Reed-Solomon parity data RS2 output to the ECC encoder 105 via the second selector 302 may be sequentially discarded.

As described above, according to the present embodiment, the first Reed-Solomon parity data RS1 and the second Reed-Solomon parity data RS2 generated for the user data YD written in each block BLK are stored in the block BLK next to the block BLK in which the user data YD is stored. Accordingly, it is possible to perform the generation of the ECC frame to be written in the next block BLK and the writing of the generated ECC frame to the non-volatile memory 20 using the first Reed-Solomon parity data RS1 and the second Reed-Solomon parity data RS2 generated for the user data YD stored in the previous block BLK before the user data YD corresponding to one block is secured in the data buffer 12, and thus it is possible to save a standby time for the writing to the non-volatile memory 20 until the user data YD corresponding to one block is secured. As a result, it is possible to perform the write process more quickly.

Since the other configurations, operations, and effects are similar to those of the embodiments described above, detailed description thereof will be omitted here.

Fourth Embodiment

Next, a memory system and a control method according to the fourth embodiment will be described in detail with reference to the appended drawings. In the read operation described with reference to FIG. 15 in the first embodiment, the block unit is used as the read access unit. On the other hand, in the fourth embodiment, a read operation in which the page unit is used as the read access unit will be described in detail with reference to the appended drawings. Further, in the following description, for configurations and operations similar to the configurations and operations in the above embodiment, the configurations and the operations described above are referred to, and thus duplicate description will be omitted.

Figure 20:
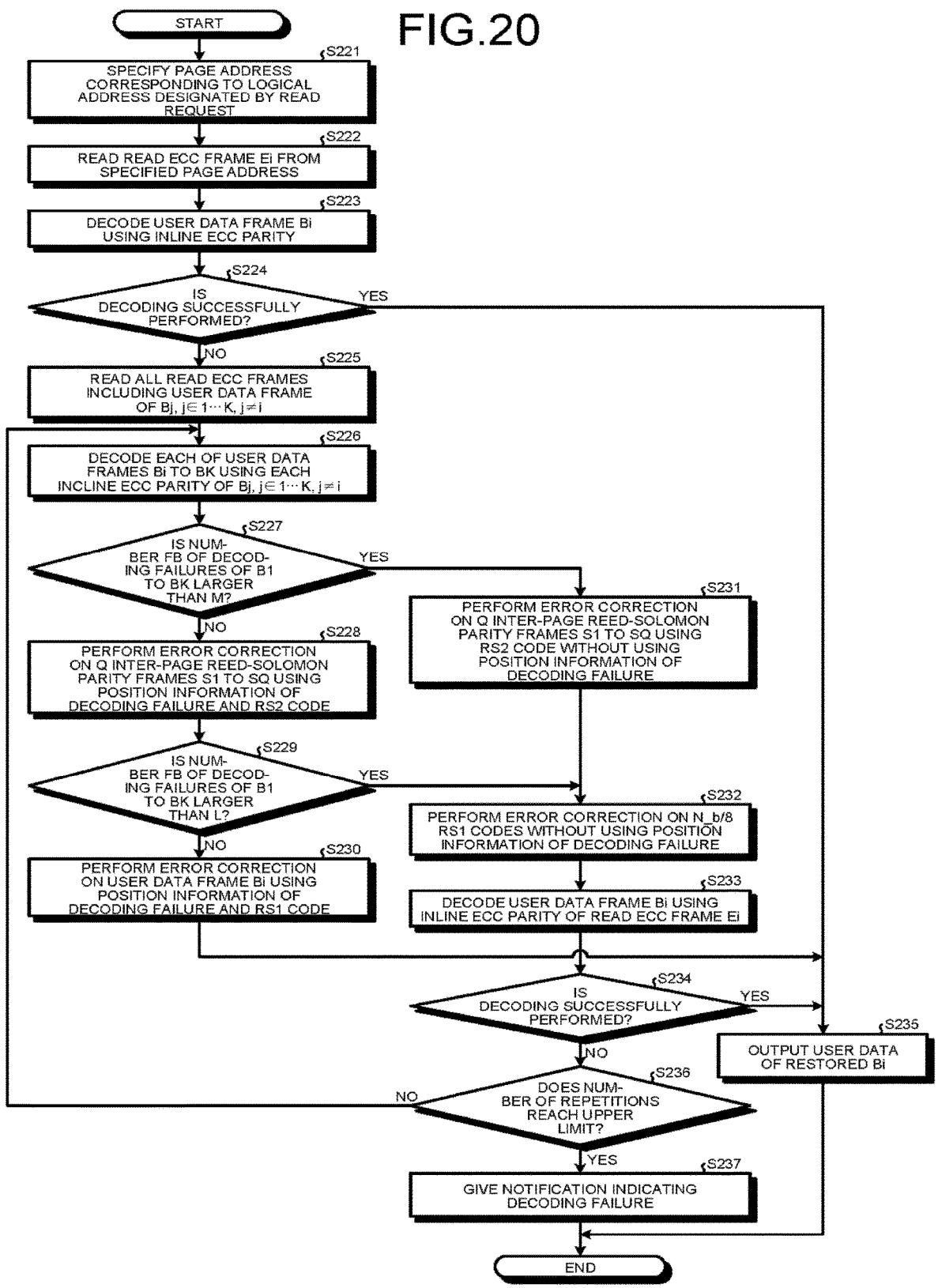
FIG. 20 is a flowchart illustrating a schematic example of a read operation according to a fourth embodiment.

FIG. 20 is a flowchart illustrating a schematic example of a read operation according to the present embodiment. In FIG. 20, similarly to FIG. 15, for the sake of simplicity of description, the first Reed-Solomon parity data is referred to as an RS1 code, and the second Reed-Solomon parity data is referred to as an RS2 code.

As illustrated in FIG. 20, in the present operation, first, the control unit 11 that has received the read request input via the host I/F 15 from the host 30 specifies a physical address (hereinafter referred to as a page address) of a page corresponding to a logical address designated by the read request with reference to, for example, an address translation table (not illustrated) (Step S221). Then, the control unit 11 instructs the memory I/F 13 to read the data from the specified page address, so that a read ECC frame Ei is read from the read target page by the memory I/F 13 (Step S222).

The read ECC frame Ei is input to the ECC decoder 106. The ECC decoder 106 decodes a user data frame Bi included in the input read ECC frame Ei using the inline ECC parity IEP which is also included in the read ECC frame Ei (Step S223). The read ECC frame Ei which has undergone the error correction obtained as a result of the decoding is stored in, for example, the read buffer memory 107.

Then, the ECC decoder 106 determines whether or not the decoding of the user data YD is successfully performed (Step S224). When the decoding is successfully performed in Step S223 (YES in Step S224), the decoder 18 outputs the user data frame Bi which has undergone the error correction in the read buffer memory 107 (Step S235). The output user data frame Bi is temporarily held in, for example, the data buffer 12 (see FIG. 1) and then transferred to the host 30 via the host I/F 15.

On the other hand, when the decoding is not successfully performed in Step S223 (NO in Step S224), the control unit 11 instructs the memory I/F 13 to read the read ECC frames E1 to EK from all the pages constituting the block including the read ECC frame Ei (here, the read ECC Frame Ei which has been read may be excluded), so that all the read ECC frames E1 to EK (excluding Ei) are read from the block including the read ECC frame Ei (Step S225).

The read ECC frames E1 to EK (excluding Ei) are input to the ECC decoder 106. The ECC decoder 106 decodes the user data frame Bi of each of the input read ECC frames E1 to EK (excluding Ei) similarly using the inline ECC parity IEP of each of the read ECC frames E1 to EK (except Ei) (Step S226). The read ECC frames E1 to EK (excluding Ei) which has undergone the error correction obtained as a result of the decoding are stored in the read buffer memory 107 together with, for example, the ad ECC frame Ei.

Then, the control unit 11 determines whether or not the number FB of read ECC frames that have failed to be decoded is greater than the number M as a result of decoding all the read ECC frames E1 to EK including the read ECC frame Ei using each inline ECC parity IEP (Step S227).

When the number FB is larger than the number M as a result of the determination in Step S227 (YES in Step S227), the first R5 decoder 108 performs the error correction on the Q inter-page Reed-Solomon parity frames S1 to SQ using the second Reed-Solomon parity data RS2 without using the position information of the read ECC frame which has failed to be decoded in response to the instruction from the control unit 11 (Step S231), and then the present operation proceeds to Step S232.

On the other hand, when the number FB is equal to or less than the number M as a result of the determination in Step S227 (NO in Step S227), the first RS decoder 108 performs the error correction on the Q inter-page Reed-Solomon parity frames S1 to SQ using both the position information of the read ECC frame which has failed to be decoded and the second Reed-Solomon parity data RS2 in response to the instruction from the control unit 11 (Step S226). Then, the control unit 11 determines whether or not the number FB of read ECC frames which have failed to be decoded is larger than the number L (Step S229). When the number FB is larger than the number L as a result of the determination, the present operation proceeds to Step S232.

On the other hand, when the number FB is equal to or less than the number L as a result of the determination in Step S229 (NO in Step S229), the second RS decoder 109 performs the error correction on the user data frame Bi using both the position information of the read ECC frame which has failed to be decoded and the first Reed-Solomon parity data RS1 in response to the instruction from the control unit 11 (Step S230). As a result, the user data frame Bi which has undergone the error correction is stored in the read buffer memory 107. Thereafter, as described above, the decoder 18 outputs the user data frame Bi which has undergone the error correction in the read buffer memory 107 (Step S233), and the present operation ends.

In Step S232, the first RS decoder 108 performs the error correction on N_b/8 pieces of first Reed-Solomon parity data RS1 without using the position information of the read ECC frame which has failed to be decoded in response to the instruction from the control unit 11. Then, the second RS decoder 109 decodes the user data frame Bi using the inline ECC parity IEP of the read ECC frame Ei which has undergone the error correction (Step S233). Then, the second RS decoder 109 determines whether or not the decoding of the user data frame Bi is successfully performed (Step S234).

When the decoding is successfully performed in Step S233 (YES in Step S234), the decoder 18 proceeds to Step S235 and outputs the user data frame Bi in the read buffer memory 107 as described above. On the other hand, when the decoding is not successfully performed (NO in Step S234), the decoder 18 determines whether or not the number of repetitions of the decoding using the first Reed-Solomon parity data RS1 and the second Reed-Solomon parity data RS2 and the decoding using the inline ECC parity IEP reaches a preset upper limit (Step S236). When the number of repetitions reaches the upper limit (YES in Step S236), the decoder 18 gives a notification indicating a decoding failure to, for example, the control unit 11 (Step S237), and the present operation ends. Further, the control unit 11 which has received the notification indicating a decoding failure transmits a read error to, for example, the host 30. On the other hand, when the number of repetitions does not reach the upper limit (NO in Step S236), the present operation returns to Step S226, and a subsequent operation is executed.

By setting the page unit as the read access unit as described above, it is possible to implement a configuration in which a minimum amount of data is read if necessary, and thus it is possible to reduce the latency at the time of data reading. In Step S223 or S226, error correction using the soft bit information may be executed on the ECC frames which are unable to be corrected through the normal error correction. At this time, the present operation transitions to Step S222 or S225, and soft bit reading is appropriately performed. The error correction using the soft bit information and the soft bit reading will be described in a fifth embodiment to be described later. Since the other configurations, operations, and effects are similar to those in the above embodiments, detailed description thereof is omitted here.

Fifth Embodiment

Next, a memory system and a control method according to the fifth embodiment will be described in detail with reference to the appended drawings. In the above embodiments, the error correction algorithm (see, for example, Step S232 in FIG. 20) that performs the error correction on the Reed-Solomon code (the first Reed-Solomon parity data RS1) without using the position information of the read ECC frame which has failed to be decoded is used. On the other hand, in the fifth embodiment, as an alternative, an error correction algorithm that performs the error correction the Reed-Solomon code (the first Reed-Solomon parity data RS1) using the soft bit information will be described as an example.

Figure 21:
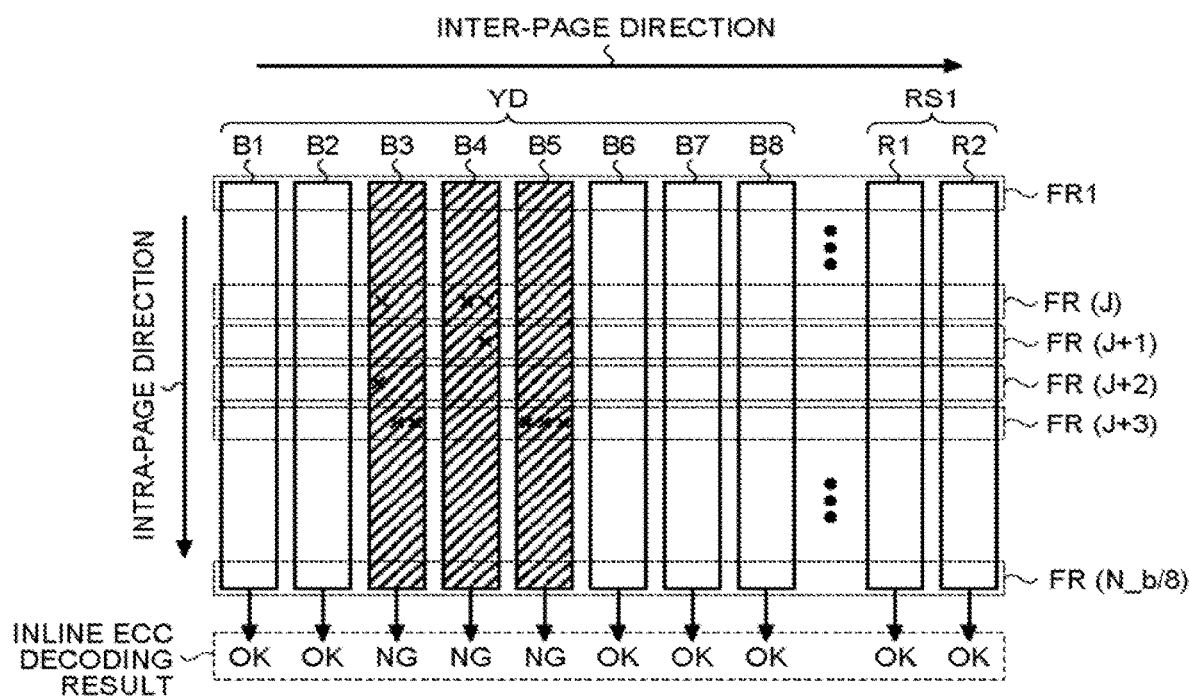
FIG. 21 is a diagram illustrating an example of a Reed-Solomon code frame according to a fifth embodiment.

FIG. 21 is a diagram illustrating an example of a Reed-Solomon code frame including a user data frame included in a read ECC frame read from the non-volatile memory and the first Reed-Solomon parity frame. In the example illustrated in FIG. 21, each of Reed-Solomon code frames FR1 to FR(N_b/8) includes eight user data frames B1 to B8 and two first Reed-Solomon parity frames R1 and R2. In FIG. 21, broken lines indicate the Reed-Solomon code frames FR1 to FR(N_b/8). In other words, each of intersections of the user data frames B1 to B8 and the Reed-Solomon code frames FR1 to FR(N_b/8) indicated by the broken line indicates one symbol of the Reed-Solomon code. The number of bits of one symbol is a value that varies depending on the size of the finite field of the first Reed-Solomon parity data RS1 and is eight bits in the above embodiments. Further, "x" indicates the position of the error bit.

Further, in the example illustrated in FIG. 21, the number M of error symbols correctable by the second Reed-Solomon parity data RS2 is two, and the number L of error symbols correctable by the first Reed-Solomon parity data RS1 is two. In FIG. 21, when the inline ECC decoding result is "OK," it means that the decoding using the inline ECC parity IEP is successfully performed, and when the inline ECC decoding result is "NG," it means that the decoding using the inline ECC parity IEP fails.

In the example illustrated in FIG. 21, paying attention to the Reed-Solomon code frames FR1 to FR(N_b/8) indicated by the broken lines, for example, the number of error symbols included in each of Reed-Solomon code frames FR(J) and FR(J+3) is two, and the number of error symbols included in each of FR(J+1) and FR(J+2) is one. For this reason, if it is possible to specify the position (page) of the error symbol, it is possible to perform the error correction on all the error symbols of the Reed-Solomon code frames FR(J) to FR(J+3) using the first Reed-Solomon parity data RS1.

However, the inline ECC decoding using the inline ECC parity IEP for the user data frames B3 to B5 has failed, and the number thereof is three. For this reason, in each of the Reed-Solomon code frames FR(J) to FR(J+3), the position of the error symbol is unable to be narrowed down to two or less.

In this regard, in the present embodiment, the position of the error symbol is specified using the soft bit information, and the error correction is performed on the Reed-Solomon code (the first Reed-Solomon parity data RS1) using the specified position of the error symbol.

Here, the soft bit information (also referred to as soft determination information) is information read through the soft bit reading (also referred to as soft determination reading). On the other hand, hard bit information (also referred to as hard determination information) is information read through hard bit reading (also referred to as hard determination reading). The hard bit reading and the soft bit reading will be described in detail below with reference to FIG. 22.

Figure 22:
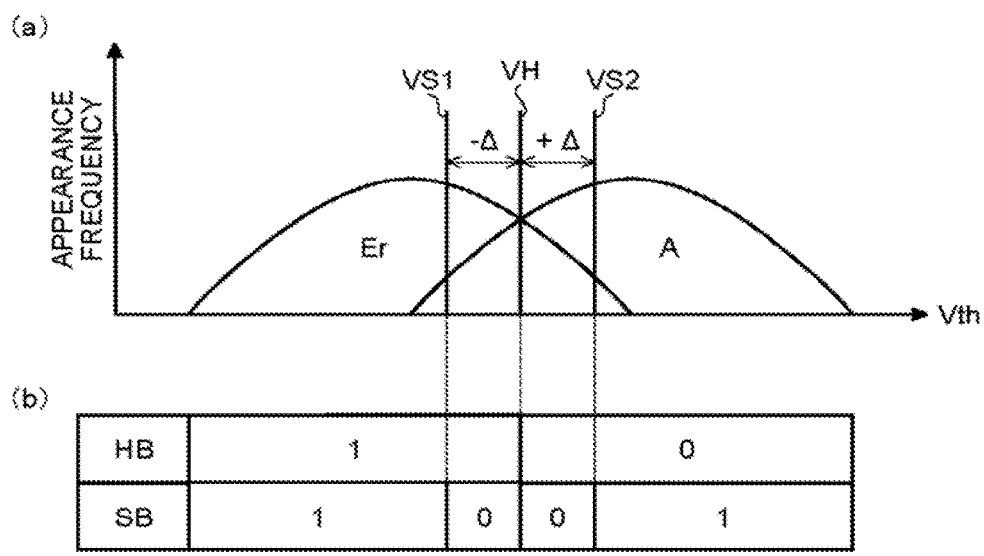
FIG. 22 is a diagram for describing hard bit read and soft bit read according to the fifth embodiment.

FIG. 22 is a diagram for describing hard bit reading and the soft bit reading according to an embodiment. In FIG. 22, for the sake of simplicity of description, an example in which the memory cell is SLC is illustrated, but the present embodiment can be similarly applied to the MLC, the TLC, the QLC or the like.

As illustrated in FIG. 22A, in a mode in which one bit of data is written in one memory cell (hereinafter referred to as an SLC mode), a threshold voltage of each memory cell belongs to either of a low voltage side distribution (referred to as an Er distribution) and a high voltage side distribution (referred to as an A distribution). Each of the Er distribution and the A distribution may be a Gaussian distribution indicating an appearance frequency (possibility) of the threshold voltage. The Er distribution corresponds to, for example, a bit value "1", and the A distribution corresponds to, for example, a bit value "0."

In order to read "1" and "0" with a bit error rate which is as low as possible from the two distributions, for example, it is necessary to set a voltage corresponding to the lowest point of a valley formed by overlapping of bottoms of the two distributions as a read voltage level (hereinafter referred to as a read level). In this regard, as illustrated in FIG. 22A, in the hard bit reading in which data (one bit) corresponding to one page is read from each memory cell, the read level VH is set near the voltage corresponding to the lowest point.

On the other hand, in the soft bit reading in which data (two or more bits) corresponding to a plurality of pages is read from each memory cell, one or more read level is set on a voltage side higher than the read level VH used in the hard bit reading and on a voltage side lower than the read level VH. In the example illustrated in FIG. 22A, one read level VS1 is set with a predetermined width ΔR on the voltage side lower than the read level VH, and one read level VS2 is set with a predetermined width ΔR on the voltage side higher than the read level VH.

In the soft bit reading, first, after the hard bit reading using the read level VH is executed, reading using the read voltage VS1 on the low voltage side and reading using the read level VS2 on the higher voltage side are sequentially executed. Then, the bit values obtained by the soft bit reading are ORed or logically ANDed. Accordingly, as illustrated in FIG. 22B, the soft bit information (SB) corresponding to one page is acquired in addition to the hard bit information (HB). In the example illustrated in FIG. 22B, the soft bit information of the bit value "0" is assigned to the threshold voltage near the valley formed by the overlapping of the bottom of the Er distribution and the bottom of the A distribution. Therefore, in the present embodiment, the soft bit information of the bit value "0" can also be regarded as, for example, information indicating that there is a high possibility of the read hard bit information being erroneous.

The soft bit reading described above may be executed, for example, in Steps S222 and S225 in FIG. 20 or may be executed as appropriate when Step S231 or S232 is executed.

Next, examples of an error correction algorithm using the soft bit information described above will be described below. The error correction algorithms described below are applied to, for example, Step S231 or S232 in FIG. 20.

First Example

In a first example of the error correction algorithm according to the present embodiment, for each of the Reed-Solomon code frames FR1 to FR(N_b/8), all patterns (hereinafter also referred to as test patterns) when two symbols among three symbols corresponding to the user data frames B3 to B5 which has failed in the inline ECC decoding are assumed to be the error symbols are generated. For example, in the example illustrated in FIG. 21, three test patterns, that is, a test pattern when two symbols corresponding to B3 and B4 are assumed to be error symbols, a test pattern when two symbols corresponding to B3 and B5 are assumed to be error symbols, and a test pattern when two symbols corresponding to B4 and B5 are assumed to be error symbols are generated.

Then, in the first example, the error correction is executed on each test pattern, and as a result, a correction result of the test pattern considered to be most likely is employed as the Reed-Solomon code which has undergone the error correction (the first Reed-Solomon parity data RS1).

For example, the correction result of the test pattern considered to be most likely can be specified by scoring the error correction results of the respective test patterns. In this scoring, it as possible to use the soft bit information of the bit whose value is flipped by the error correction. For example, in a case in which the bit in which the soft bit information is "0" is flipped, "1" is added to the score, and in a case in which the bit in which the soft bit information is "1" is flipped, "3" is added to the score. In this case, since the score is lowered as the bit, which is more likely to be erroneous, is flipped, the correction result of the test pattern with the lowest score is selected as the correction result of the test pattern considered to be most likely. Here, when the lowest score exceeds a preset threshold value, the next process may be executed while invalidating the error correction at that time (without error correction).

Second Example

In a second example of the error correction algorithm according to the present embodiment, in a case in which two symbols including a bit in which the soft bit information is "0" are included in three symbols corresponding to the user data frames B3 to B5 which have failed in the inline ECC decoding in each of the Reed-Solomon code frames FR1 to FR(N_b/8), the two symbols are regarded as the error symbols, and the error correction is executed. At this time, when the number of bits flipped in the error correction exceeds a predetermined threshold value, the next process may be executed while invalidating the error correction at that time (without error correction).

Third Example

In a third example of the error correction algorithm according to the present embodiment, two symbols in the descending order of the number of bits in which the soft bit information is "0" among three symbols corresponding to the user data frames B3 to B5 which have failed in the inline ECC decoding in each of the Reed-Solomon code frames FR1 to FR(N_b/8) are assumed to be the error symbols, and the error correction is executed. Similarly to the second example, when the number of bits flipped in the error correction exceeds a predetermined threshold value, the next process may be executed while invalidating the error correction at that time (without error correction).

As described above, it is possible to perform the error correction on the Reed-Solomon code (the first Reed-Solomon parity data RS1) by using the soft bit information instead of the position information of the read ECC frame which has failed to be decoded. Since the other configurations, operations, and effects are similar to those in the above embodiment, detailed description thereof is omitted here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
   a non-volatile memory including a plurality of blocks, each block including a plurality of pages;
   a memory interface configured to execute writing and reading on the non-volatile memory;
   an encoder configured to perform encoding in first write mode, the encoding in the first write mode including:
   first encoding on a first number of data frames written in a first block among the plurality of blocks to generate first parity data, the first encoding including a processing of generating, from symbols each belonging to a different data frame among the first number of data frames, a code in the first parity data,
   dividing the first parity data into a second number of pieces of second parity data,
   second encoding on the second number of pieces of second parity data,
   to generate a third number of pieces of third parity data, the second encoding including a processing of generating, from symbols each belonging to a different piece of second parity data among the second number of pieces of second parity data, a code among the third number of pieces of third parity data, and generating a first number of pieces of first frame data by concatenating each of the second number of pieces of second parity data with each of a second number of data frames among the first number of data frames, and concatenating each of the third number of pieces of third parity data with each of a third number of data frames among the first number of data frames, third encoding on each of the first number of pieces of first frame data to generate a first number of pieces of fourth parity data, wherein, in the first write mode, the memory interface writes each of a first number of pieces of second frame data obtained by concatenating each of the first number of pieces of first frame data and each of the plurality first number of pieces of fourth parity data into a different page among a plurality of pages in the first block.

2. The memory system according to claim 1, further comprising a write buffer memory, wherein, in a case in which the first number of data frames are stored in the write buffer memory, the encoder performs the encoding in the first write mode.

3. The memory system according to claim 1, further comprising, a control unit configured to execute garbage collection of transcribing valid data stored in one or more blocks among the plurality of blocks in another block, wherein the memory system is connected to a host, in a case in which the first number of data frames are the valid data undergoing transcribing in the garbage collection, the encoder performs the encoding in the first write mode on the first number of data frames, in a case in which a fourth number of data frames are received from host, the encoder performs encoding in second write mode on the fourth number of data frames to generate fifth parity data, the encoding in the second write mode includes a processing of generating, from symbols each belonging to a different data frame among the fourth number of data frames, a code in the fifth parity data, and the memory interface, in the second write mode, writes each of the fourth number of data frames into a different page among a fourth number of pages among a plurality of pages in a second block, and writes the fifth parity data into a page different from the fourth number of pages among the plurality of pages in the second block.

4. The memory system according to claim 1, further comprising:

a first decoder configured to perform first decoding on the first parity data read from the first block using the third number of pieces of third parity data read from the first block; and a second decoder configured to perform second decoding on the first number of data frames read from the first block using the first parity data which has undergone error correction by the first decoding.

5. The memory system according to claim 4, further comprising, a third decoder configured to perform third decoding on the first number of pieces of second frame data read from the first block using the first number of pieces of fourth parity data included in the first number of pieces of second frame data, wherein, in a case in which the third decoding by the third decoder on each of the first number of pieces of second frame data read from the first block is not successfully performed, the first decoder executes the first decoding, and the second decoder executes the second decoding.

6. The memory system according to claim 5, wherein, in a case in which the second decoding by the second decoder is not successfully performed, the third decoder executes the third decoding using a part of data frame which has undergone error correction by the second decoding and the third parity data again.

7. The memory system according to claim 5, wherein the memory interface reads second frame data from at least one page included in the first block and in a case in which the third decoding by the third decoder on the read second frame data is not successfully performed, the memory interface reads the first number of pieces of second frame data from the first block.

8. The memory system according to claim 5, wherein, in a case in which a sixth number or less of pieces of second frame data among the first number of pieces of second frame data failed in the third decoding, the first decoder executes the first decoding on the first parity data again using position information of the second frame data failed in the third decoding and the third number of pieces of third parity data, in a case in which more than the six number of pieces of second frame data among the first number of pieces of second frame data failed in the third decoding, the first decoder executes the first decoding on the first parity data again using the third number of pieces of third parity data without using the position information of the second frame data failed in the third decoding, and the second decoder again executes the second decoding using the first parity data which has undergone error correction by the first decoding again on the first number of pieces of second frame data.

9. The memory system according to claim 5, wherein the memory interface acquires soft bit information from the first block, in a case in which a six number or less of pieces of second frame data among the first number of pieces of second frame data failed in the third decoding, the first decoder executes the first decoding on the first parity data again using position information of the second frame data failed in the third decoding and the third number of pieces of third parity data, in a case in which more than the six number of pieces of second frame data among the first number of pieces of second frame data failed in the third decoding, the first decoder executes the first decoding on the first parity data again using the third number of pieces of third parity data, and the second decoder again executes the second decoding using the first parity data which has undergone the error correction by the first decoding again and the soft bit information on the first number of pieces of second frame data.

10. The memory system according to claim 1, wherein the first parity data and the third number of pieces of third parity data are parity data of a Reed-Solomon code.

11. The memory system according to claim 1, wherein each of the plurality of blocks is a physical block or a logical block.

12. A memory system, comprising:

a non-volatile memory including a plurality of blocks, each block including a plurality of pages;

a memory interface configured to execute writing and reading on the non-volatile memory;

an encoder configured to perform:
> first encoding, on a first number of first data frames written in a first block among the plurality of blocks to generate first parity data, the first encoding including a processing of generating, from symbols each belonging to a different first data frame among the first number of first data frames, a code in the first parity data,
> dividing the first parity data into a second number of pieces of second parity data,
> second encoding on the second number of pieces of second parity data
>
> to generate a third number of pieces of third parity data, the second encoding including a processing of generating, from symbols each belonging to a different piece of second parity data among the second number of pieces of second parity data, a code among the third number of pieces of third parity data, and
>
> > generating a first number of pieces of first frame data by concatenating each of the second number of pieces of second parity data with each of a second number of second data frames among a first number of second data frames written in a second block different from the first block among the plurality of blocks, and concatenating each of the third number of pieces of third parity data with each of a third number of second data frames among the first number of second data frames,
> > third encoding on each of the first number of pieces of first frame data to generate a first number of pieces of fourth parity data,
>
> wherein the memory interface writes a first number of pieces of second frame data obtained by concatenating each of the first number of pieces of first frame data and each of the first number of pieces of fourth parity data into a different page among a plurality of pages in the second block.

13. The memory system according to claim 12, further comprising:
> a first decoder configured to perform error correction on the first parity data read from the second block using the third number of pieces of third parity data read from the second block; and
> a second decoder configured to decode the first number of first data frame read from the first block using the first parity data which has undergone error correction using the third number of pieces of third parity data.

14. The memory system according to claim 12, wherein the first parity data and the third number of pieces of third parity data are parity data of a Reed-Solomon code.

15. A method of controlling a non-volatile memory including a plurality of blocks, the method comprising:
> first encoding a first number of data frames written in a first block among the plurality of blocks to generate first parity data, the first encoding including a processing of generating, from symbols each belonging to a different data frame among the first number of data frames, a code in the first parity data;
> dividing the first parity data into a second number of pieces of second parity data;
> second encoding the second number of pieces of second parity data to generate a third number of pieces of third parity data, the second encoding including a processing of generating, from symbols each belonging to a different piece of second parity data among the second number of pieces of second parity data, a code among the third number of pieces of third parity data;
> generating a first number of pieces of first frame data by concatenating each of the second number of pieces of second parity data with each of a second number of data frames among the first number of data frames, and concatenating each of the third number of pieces of third parity data with each of a third number of data frames among the first number of data frames;
> third encoding each of the first number of pieces of first frame data to generate a first number of pieces of fourth parity data; and
> writing each of a first number of pieces of second frame data obtained by concatenating each of the first number of pieces of first frame data and each of the first number of pieces of fourth parity data into a different page among a plurality of pages in the first block.

16. The method of controlling the non-volatile memory according to claim 15, further comprising:
> performing first decoding on the first parity data read from the first block using the third number of pieces of third parity data read from the first block; and
> performing second decoding on the first number of data frames read from the first block using the first parity data which has undergone error correction by the first decoding.

17. The control method of controlling the non-volatile memory according to claim 16, further comprising,
> performing third decoding on the first number of pieces of second frame data read from the first block using the first number of pieces of fourth parity data included in the first number of pieces of second frame data,
> wherein, in a case in which the third decoding on each of the first number of pieces of second frame data read from the first block is not successfully performed, the first decoding and the second decoding are executed.

18. The method of controlling the non-volatile memory according to claim 17, wherein, in a case in which the second decoding is not successfully performed, the third decoding is executed using a part of data frame which has undergone error correction by the second decoding and the third parity data again.

19. The control method of controlling the non-volatile memory according to claim 17, further comprising:
> reading second frame data from at least one page included in the first block and
> in a case in which the third decoding on the read second frame data is not successfully performed, reading the first number of pieces of second frame data from the block.

20. A method of controlling a non-volatile memory including a plurality of blocks, the method comprising:
> first encoding a first number of first data frames written in a first block among the plurality of blocks to generate first parity data, the first encoding including a processing of generating, from symbols each belonging to a different first data frame among the first number of first data frames, a code in the first parity data;
> dividing the first parity data into a second number of pieces of parity data;
> second encoding the second number of pieces of second parity data to generate a third number of pieces of third parity data, the second encoding including a processing of generating, from symbols each belonging to a different piece of second parity data among the second number of pieces of second parity data, a code among the third number of pieces of third parity data;
> generating a first number of pieces of first frame data by concatenating each of the second number of pieces of second parity data with each of a second number of second data frames among a first number of second data frames written in a second block different from the first block among the plurality of blocks, and concatenating each of the third number of pieces of third parity data with each of a third number of second data frames among the first number of second data frames;

third encoding each of the first number of pieces of first frame data to generate a first number of pieces of fourth parity data; and writing a first number of pieces of second frame data obtained by concatenating each of the first number of pieces of first frame data and each of the first number of pieces of fourth parity data into a different page among a plurality of pages in the second block.

* * * * *